US007018110B2

(12) United States Patent
Kuhara et al.

(10) Patent No.: US 7,018,110 B2
(45) Date of Patent: Mar. 28, 2006

(54) OPTICAL MODULE

(75) Inventors: Yoshiki Kuhara, Osaka (JP); Hiromi Nakanishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 247 days.

(21) Appl. No.: 10/627,074

(22) Filed: Jul. 24, 2003

(65) Prior Publication Data

US 2004/0017978 A1   Jan. 29, 2004

(30) Foreign Application Priority Data

Jul. 25, 2002   (JP) .......................... P2002-216923

(51) Int. Cl.
G02B 6/36         (2006.01)
(52) U.S. Cl. ............................ 385/89; 385/14; 385/49; 385/92; 398/140; 398/141
(58) Field of Classification Search ................. 385/14, 385/49, 88, 89, 92; 398/140, 141
See application file for complete search history.

(56) References Cited

U.S. PATENT DOCUMENTS

| 5,841,562 | A | * | 11/1998 | Rangwala et al. ........... 398/139 |
| 5,867,622 | A | * | 2/1999 | Miyasaka et al. ............ 385/88 |
| 6,106,160 | A | * | 8/2000 | Kikuchi et al. .............. 385/88 |
| 6,318,908 | B1 | * | 11/2001 | Nakanishi et al. ........... 385/89 |
| 6,334,716 | B1 | * | 1/2002 | Ojima et al. ................. 385/89 |
| 6,513,993 | B1 | | 2/2003 | Nakanishi et al. ........... 385/92 |
| 6,547,451 | B1 | * | 4/2003 | Nishikawa et al. .......... 385/88 |
| 2003/0044119 | A1 | * | 3/2003 | Sasaki et al. ................ 385/49 |
| 2003/0235371 | A1 | * | 12/2003 | Shimada et al. ............. 385/50 |

FOREIGN PATENT DOCUMENTS

| JP | 11-109184 | 4/1999 |
| JP | 2001-100062 | 4/2001 |

* cited by examiner

Primary Examiner—Sung Pak
Assistant Examiner—Daniel Petkovsek
(74) Attorney, Agent, or Firm—Fish & Richardson P.C.

(57) ABSTRACT

In optical module 1a, substrate 3 has first and second regions 3a, 3b and first and second optical waveguides 3c, 3d. First and second regions 3a, 3b are arranged along a predetermined plane. First and second optical waveguides 3d, are provided in the first region 3a and extend in a direction of a predetermined axis. Semiconductor light emitting device 7 includes a semiconductor light emitting element 7a optically coupled to first optical waveguide 3c and provided in second region 3e. Semiconductor driving element 9 is electrically connected to semiconductor light emitting element 7a. Semiconductor driving element 9 is mounted on mount member 13. Optical element 15a reflects a part of incident light and transmits a part of the incident light, and semiconductor light receiving device 17 includes a light receiving element 17a provided in first region 3a so as to be optically coupled to optical element 15a.

26 Claims, 16 Drawing Sheets

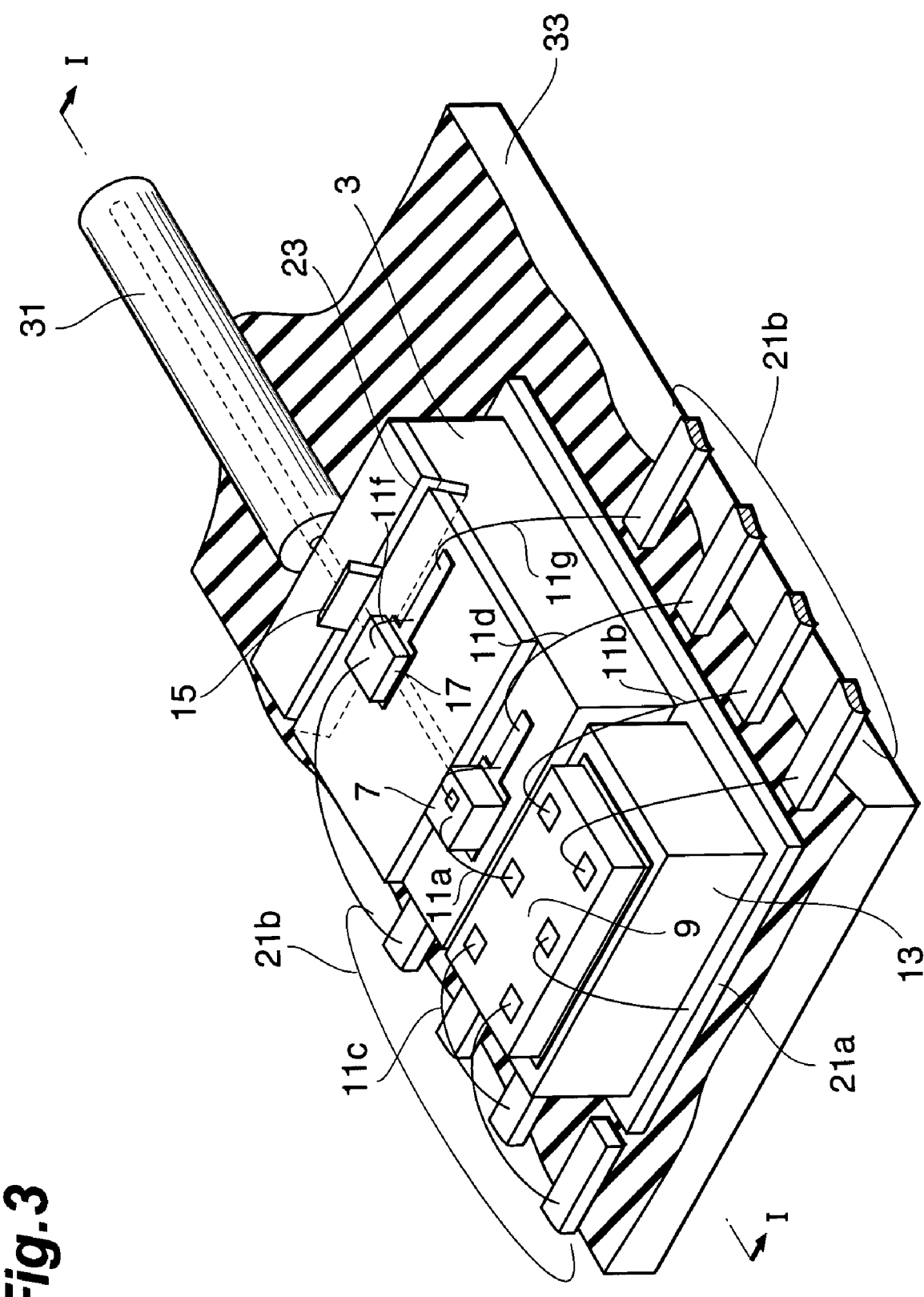

OPTICAL MODULE

BACKGROUND OF THE INVENTION

1. Field of the Invention

The present invention relates to an optical module.

2. Related Background Art

An optical module includes a semiconductor laser element. The semiconductor laser element generates an optical signal in response to an externally applied electric signal. In one example, the optical modules together with a driving element are provided on a printed circuit board. The driving element generates an electric signal for driving the optical module. Optical modules have a variety of uses and are used in optical communication systems, such as trunk optical communication systems and in metro optical communication systems.

SUMMARY OF THE INVENTION

In order to implement fast optical communications, optical modules are required to operate at higher transmission rates. With the increasing range of applications of optical communications, these applications need low-priced optical modules. In the recent optical communications, the optical modules are required to generate optical signals of transmission rates as high as several gigabits per second.

It is an object of the present invention to provide an optical module having a structure enabling the monitoring of a forward light from a semiconductor light emitting element driven by a driving element for generating a drive signal.

According to one aspect of the present invention, an optical module comprises: a substrate, a semiconductor light emitting device, a semiconductor light receiving device, and an optical device. The substrate has first and second regions and first and second optical waveguides. The first and second regions are arranged along a predetermined plane. The first and second optical waveguides is provided in the first region. The first and second optical waveguides extend in a direction of a predetermined axis. The semiconductor light emitting device includes a semiconductor light emitting element. The semiconductor light emitting device is provided in the second region. The semiconductor light emitting element is optically coupled to the second optical waveguide. The semiconductor light receiving device includes a light receiving element. The semiconductor light receiving device is provided in the first region. The optical device includes an optical element. The optical element is provided on the first region so as to reflect a part of incident light from the light emitting element to the light receiving element and so as to transmit a part of the incident light. The light receiving element is optically coupled to the optical element. The optical element is provided between the first and second optical waveguides. The optical element is optically coupled to the first and second optical waveguides.

The optical module further comprises a semiconductor driving element and a mount member. The semiconductor driving element is electrically connected to the semiconductor light emitting element. The semiconductor driving element is mounted on the mount member. The substrate and the mount member are arranged along the predetermined plane.

The optical module further comprises a semiconductor driving element electrically connected to the semiconductor light emitting element. The substrate has a third region. The first to third regions are arranged along the predetermined plane. The semiconductor driving element is provided in the third region of the substrate.

In the optical module, the substrate further includes at least one third optical waveguide and at least one fourth optical waveguide. The third optical waveguide and the fourth optical waveguide extend in a direction of another predetermined axis. The semiconductor light emitting device further includes another semiconductor light emitting element provided in the second region. The fourth waveguide is optically coupled to the other semiconductor light emitting element. The optical device further includes another optical element provided between the third and fourth optical waveguides. The semiconductor light receiving device further includes another light receiving element provided in the first region. The other semiconductor light emitting element is electrically connected to the semiconductor driving element. The other optical element is optically coupled to the third and fourth optical waveguides. The other optical element is provided on the first region so as to reflect a part of incident light from the other light emitting element to the other light receiving element and so as to transmit a part of the incident light. The other light receiving element is optically coupled to the other optical element. The other optical element is provided between the third waveguide and the fourth waveguide.

In the optical module, the substrate includes a groove provided in the first region. The substrate has a pair of edges extending in the direction of the predetermined axis. The groove extends from one of the pair of edges to the other and extends along a reference plane intersecting with the predetermined plane. The optical device is provided in the groove.

In the optical module, the optical axis of the first optical waveguide extends along a reference axis. The reference axis forms an acute angle with the reference plane.

In the optical module, the first region has a primary surface. The primary surface has a first area and a second area. The first waveguide is located in the first area, and the second waveguide is located in the second area. The semiconductor light receiving device is located on the second area.

In the optical module, the optical device has a transparent substrate. Light from the semiconductor light emitting element can pass through the transparent substrate. The transparent substrate has a pair of surfaces, each extending along a plane intersecting with the predetermined axis. One of the pair of surfaces is inclined so as to reflect a part of incident light from the light emitting element to the light receiving element.

According to another aspect of the present invention, an optical module comprises a substrate, a first optical fiber, a second optical fiber, a semiconductor light emitting device, a semiconductor driving element, an optical device, and a semiconductor light receiving device. The substrate having first and second regions are arranged along a predetermined plane. The first optical fiber is provided in the first region of the substrate. The first optical fiber extends in a direction of a predetermined axis. The second optical fiber is provided in the first region of the substrate. The second optical fiber extends in the direction of the predetermined axis. The semiconductor light emitting device is provided in the second region. The semiconductor light emitting device includes a semiconductor light emitting element. The semiconductor light emitting element is optically coupled to the second optical fiber. The semiconductor driving element is electrically connected to the semiconductor light emitting element. The optical device includes an optical element. The optical element is provided on the first region so as to reflect a part of incident light and so as to transmit a part of the incident light. The semiconductor light receiving device includes a light receiving element. The light receiving element is provided in the first region. The light receiving element is optically coupled to the optical element. The optical element is provided between the first optical fiber and the second optical fiber. The optical element is optically coupled to the first optical fiber and to the second optical fiber.

The optical module further comprises a mount member. The semiconductor driving element is mounted on the mount member. The mount member and the substrate are arranged along the predetermined plane.

In the optical module, the substrate further includes a third region. The first to third regions are arranged along the predetermined plane. The semiconductor driving element is provided on the third region.

The optical module further comprises at least one third optical fiber and at least one fourth optical fiber. The third optical fiber and the fourth optical fiber extend in a direction of another predetermined axis. The semiconductor light emitting device further includes another semiconductor light emitting element is provided in the second region. The other semiconductor light emitting element is optically coupled to the fourth optical fiber. The semiconductor light receiving device further includes another light receiving element provided in the first region. The optical device further includes another optical element provided between the third and fourth optical fibers. The other optical element is provided on the first region so as to reflect a part of incident light from the other light emitting element to the other light receiving element and so as to transmit a part of the incident light. The other optical element is optically coupled to the third and fourth optical fibers. The other light receiving element is optically coupled to the other optical element. The other semiconductor light emitting element is electrically connected to the semiconductor driving element.

In the optical module, the first region has a primary surface. The primary surface has a first area and a second area. The first and second areas are arranged along the predetermined axis. The first optical fiber is located in the first area. The second optical fiber is located in the second area. The semiconductor light receiving device is located on the second area.

In the optical module, the second fiber is provided between the light receiving element and the substrate.

The optical module further comprises a mount part. The semiconductor light receiving device is mounted on the mount part. The second optical fibers is provided between the mount part and the substrate.

In the optical module, the substrate includes a groove provided in the first region. The substrate has a pair of edges extending in the direction of the predetermined axis. The groove extends from one of the pair of edges to the other and extends along a reference plane intersecting with the predetermined plane. The optical device is provided in the groove.

In the optical module, the optical axis of the first optical fiber extends along a reference axis. The reference axis forms an acute angle with the reference plane.

In the optical module, the optical device has a transparent substrate. Light from the semiconductor light emitting element can pass through the transparent substrate. The transparent substrate has a pair of surfaces, each extending along a plane intersecting with the predetermined axis. One of the pair of surfaces is inclined so as to reflect a part of incident light from the light emitting element to the light receiving element.

In the optical module, the optical device has a transparent substrate and a dielectric multilayer film. Light from the semiconductor light emitting element can pass through the transparent substrate. The dielectric multilayer film is provided on the transparent substrate. One of the pair of surfaces is inclined so as to reflect a part of incident light from the light emitting element to the light receiving element.

The optical module further comprises a transparent resin. The transparent resin is provided on the substrate so as to cover the semiconductor light emitting element, the light receiving element, and the optical element. Light from the semiconductor light emitting element can pass through the transparent resin.

In the optical module, the light receiving element has a light entrance surface which receives light from the optical element. The light receiving element is located such that the light entrance surface is directed toward the first optical fiber. The light receiving element is a back illuminated type semiconductor light receiving element.

The optical module further comprises a lead frame having an island and a plurality of lead terminals. The substrate is mounted on the island.

The optical module further comprises a resin containing the substrate, the semiconductor light emitting element, the light receiving element, and the semiconductor driving element therein.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

The teaching of the present invention can be readily understood in view of the following detailed description with reference to the accompanying drawings provided for the illustrative purpose.

FIG. 3 is a perspective view showing the optical module having a molded resin.

DESCRIPTION OF THE PREFERRED EMBODIMENTS

Subsequently, the embodiments of optical communication modules according to the present invention will be described with reference to the accompanying drawings. If possible, the same portions will be denoted by the same reference symbols.

(First Embodiment)

Figure 1:
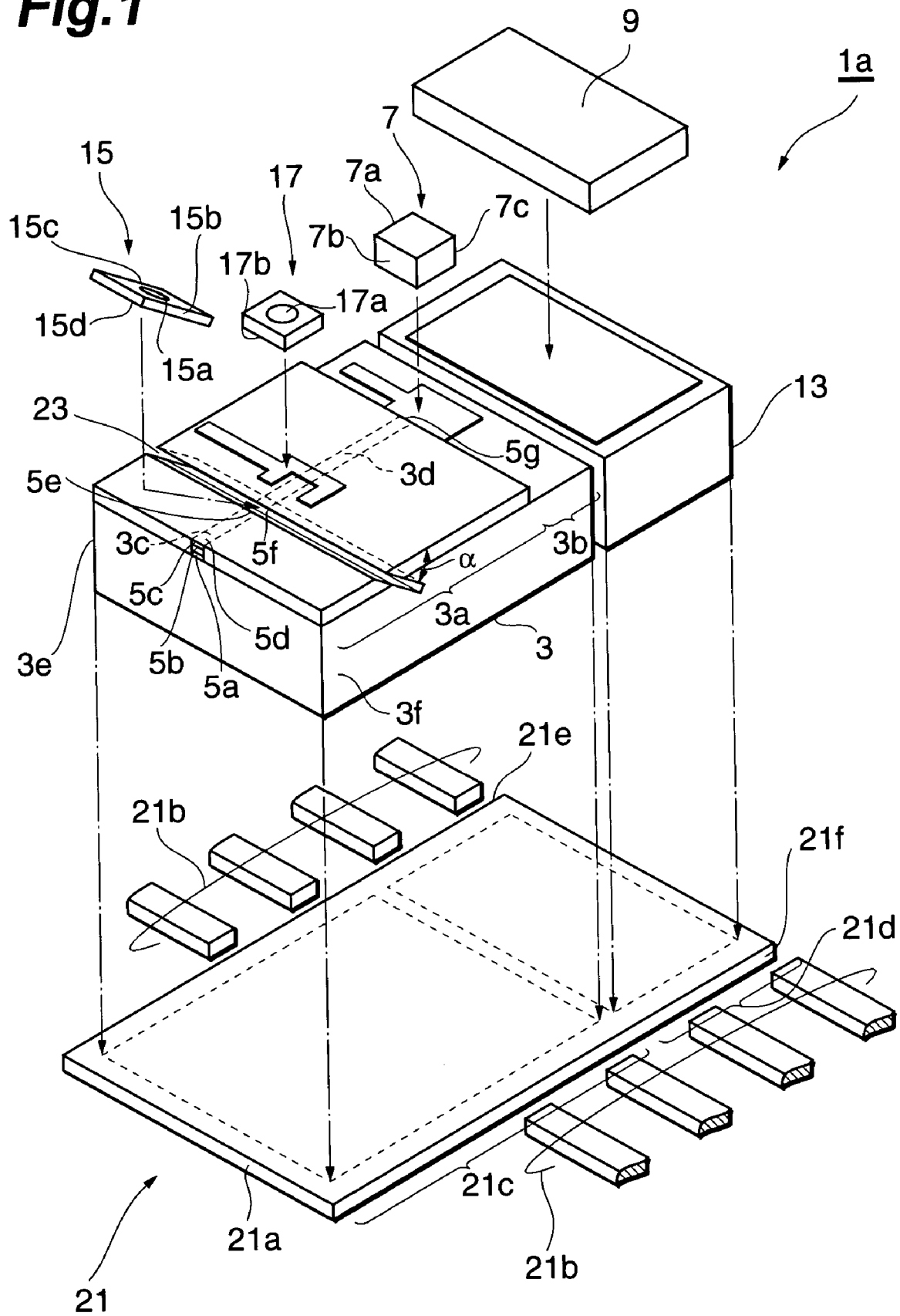
FIG. 1 is a view showing the primary components of the optical module in the first embodiment.
Figure 2:
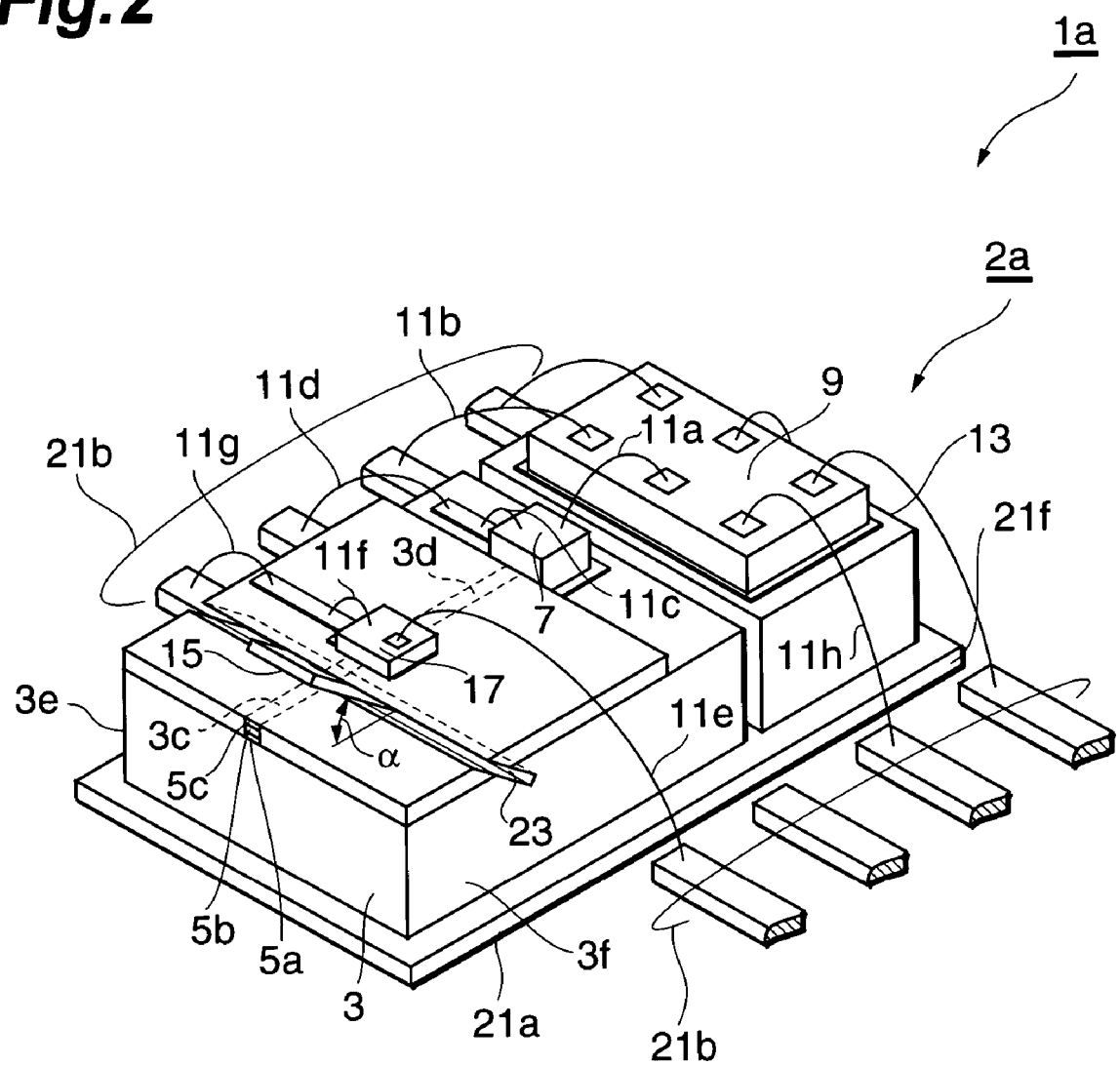
FIG. 2 is a view showing the substrate product of the optical module according to the embodiment.

FIG. 1 is a view showing primary components of the optical module according to an embodiment of the present invention. FIG. 2 is a view showing a substrate product of the optical module according to the embodiment of the present invention. With reference to FIGS. 1 and 2, the substrate product 2a in the optical module 1a comprises a substrate 3, a semiconductor light emitting device 7, a semiconductor driving element 9, a mount member 13, an optical device 15, and a semiconductor light receiving device 17.

The substrate 3 has a first region 3a and a second region 3b. The first and second regions 3a, 3b are arranged in order along a predetermined plane. The substrate 3 is, for example, a silicon substrate and the width of the substrate 3 is approximately 2 to 3 millimeters, the length thereof is approximately 3 to 5 millimeters, and the thickness thereof is approximately 1 to 1.5 millimeters. The substrate 3 also has a first optical waveguide 3c and a second optical waveguide 3d. The first and second optical waveguides 3c, 3d are provided in the first region 3a and extend in a direction of a predetermined axis. Each of these optical waveguides 3c, 3d comprises a first cladding layer 5a provided on the substrate 3, a core layer 5b provided on the first cladding layer 5a, and a second cladding layer 5c provided on the core layer 5b. Each of the optical waveguides 3c, 3d has a structure including, for example, an $SiO_2$ film provided on the (100) silicon plane, an underclad $SiO_2$ layer provided on the $SiO_2$ film, an $SiO_2$—$GeO_2$ core layer provided on the underclad $SiO_2$ layer, and an overclad $SiO_2$ layer provided on the core layer. The first optical waveguide 3c has ends 5d, 5e, and the second optical waveguide 3d has ends 5f, 5g. In a preferred example, the underclad $SiO_2$ layer has the thickness of approximately 10 micrometers and the overclad $SiO_2$ layer is the thickness of approximately 10 micrometers. The core layer has the width of approximately 6 micrometers and the thickness of approximately 6 micrometers. The illustrative structure of the substrate 3 has a base portion and an optical waveguide portion provided on the base portion.

The semiconductor light emitting device 7 includes a semiconductor light emitting element 7a and is provided in the second region 3b of the substrate 3. The semiconductor light emitting device 7 may include, for example, a semiconductor laser element or a semiconductor optical amplifier. For example, the semiconductor light emitting element 7a emits light in the 1.3 micrometer wavelength band or 1.55 micrometer wavelength band. The semiconductor light emitting element 7a has a pair of end faces 7b, 7c, and one end face 7b is optically coupled to one end 5g of the optical waveguide 3d. The optical reflectivity of one end face 7c is greater than that of the other end face 7b. If the semiconductor light emitting device 7 is a semiconductor laser element, the pair of end faces 7b, 7c form an optical cavity.

The semiconductor driving element 9 is mounted on mount member 13. The mount member 13 and the substrate 3 are arranged along the predetermined plane. The semiconductor driving element 9 is electrically connected through connecting member 11a, such as a bonding wire, to the semiconductor light emitting element 7. The semiconductor driving element 9 receives a pair of electric signals and generates a single drive signal from these electric signals. The single drive signal is applied to the semiconductor light emitting element 7a.

The optical device 15 includes an optical element 15a capable of reflecting a part of incident light and another part of transmitting part of the incident light. The optical element 15a may be, for example, an optical filter. The optical element 15a is provided between first optical waveguide 3c and second optical waveguide 3d. The optical element 15a includes a transparent substrate 15b through which the light emitted by the semiconductor light emitting element 7a can pass. The transparent substrate 15b has a pair of surfaces 15c, 15d, each extending along a surface intersecting with the predetermined axis, and one surface 15c transmits a part of the incident light and reflects another part of the incident light. One surface 15c faces one end 5f of the optical waveguide 3d and is optically coupled to one end 5f of the optical waveguide 3d. The other surface 15d faces one end 5e of the optical waveguide 3c and is optically coupled to one end 5e of the optical waveguide 3c.

The semiconductor light receiving device 17 includes a light receiving element 17a mounted in the first region 3a so as to be optically coupled to the optical element 15a. The light receiving element 17a receives a part of the light from the semiconductor light emitting element 7a through optical waveguide 3d and the optical element 15a. The remaining part of the light passes through the optical element 15a and enters the optical waveguide 3c. The optical device 15 is positioned with respect to the substrate 3, and the semiconductor light receiving device 17 is positioned with respect to the substrate 3. Thus, the optical device 15 is positioned with respect to the semiconductor light receiving device 17. This positioning enables the semiconductor light receiving device 17 to monitor the light from the semiconductor light emitting element 7a.

Since the light receiving element 17a can be provided in the first region 3a of the substrate 3, the distance between the substrate 3 and the mount member 13, mounting the semiconductor driving element 9, can be small, so that the distance between the semiconductor driving element 9 and the semiconductor light emitting element 7 become small and the light receiving element 17a can receive the forward light of the semiconductor light emitting element 7 through the optical waveguide 3d on the substrate 3.

The light receiving element 17a has light entrance surface 17b which receives the light from the optical element 15a. The light receiving element 17a is provided such that the light entrance surface 17b extends along a plane extending in a direction in which the primary surface of the substrate 3 extends. The light receiving element 17a can be, for example, a back illuminated type semiconductor light receiving element.

The optical module 1a may be further provided with a lead frame 21. The lead frame 21 has an island 21a and a plurality of lead terminals 21b. The substrate 3 is mounted on the island 21a. The primary surface of the island 21a has a first portion 21c and a second portion 21d. The first portion 21c and second portion 21d are arranged in the direction of the predetermined axis. The substrate 3 and the mount member 13 are arranged in the direction of the predetermined axis on the island 21a. The substrate 3 is mounted on the first portion 21c and the mount member 13 is mounted on the second portion 21d. The island 21a has a pair of edges 21e, 21f, some of the lead terminals 21b are arranged such that one ends of these lead terminals 21b face the edge 21e, and others of the lead terminals 21b are arranged such that one ends of these lead terminals 21b face the edge 21f. The lead frame 21 enables electrical connections among the semiconductor light emitting element 7, light receiving element 17 and semiconductor driving element 9, and enables the mounting of the substrate 3 and the mount member 13.

Referring to FIG. 2, the semiconductor driving element 9 is connected through a pair of connecting members 11b, such as bonding wires, to the lead terminals 21b. The semiconductor light emitting device 7 has an anode and a cathode, and one of the anode and cathode receives a drive signal from the semiconductor driving element 9 through the connecting member 11a and receives power through the connecting members 11c and 11d. The semiconductor light receiving device 17 has an anode and a cathode, and one of the anode and cathode provides a photocurrent through connecting member 11e and receives power through connecting members 11f and 11g.

Referring back to FIGS. 1 and 2, the substrate 3 in optical module 1a has a groove 23. The groove 23 is positioned with respect to the light receiving element 17a and extends so as to intersect with the optical transmission path constituted by the optical waveguides 3c and 3d. The substrate 3 has a pair of edges 3e and 3f, each extending in the direction of the predetermined axis. The groove 23 extends from one edge 3e of the pair of edges to the other edge 3f and extends along a reference plane intersecting with the predetermined surface. This reference plane intersects with the primary surface of the substrate 3 so as to make an acute angle therewith referred as Symbol α (alpha). The optical device 15 is provided in the groove 21. The symbol α (alpha) indicating the inclination of the groove 23 shows the angle that the optical element 17a forms with the optical transmission path constituted by the optical waveguides 3c and 3d. In a preferred example, the angle which the primary surface of the substrate 3 forms with the light entrance surface of optical element 15a is preferably in the range of not less than 45 degrees and not more than 75 degrees, and is more preferably approximately 60 degrees within this range. If the angle falls within the range, the optical module 1a has the advantage that the reflected light easily enters the light receiving element 17a.

Figure 4A:
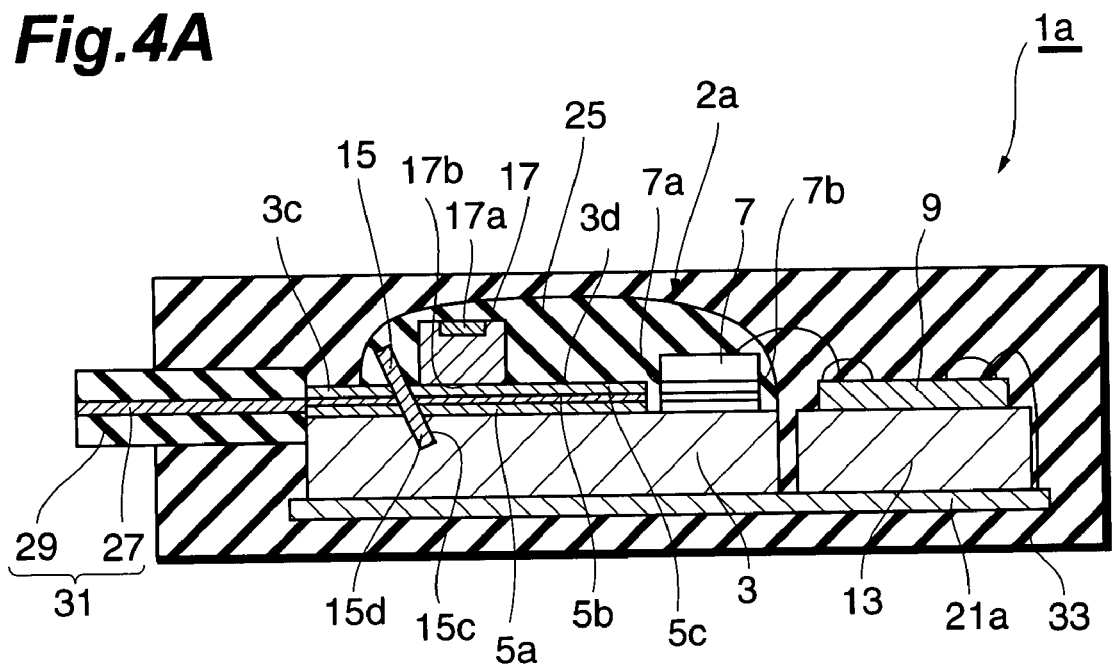
FIG. 4A is a sectional view, taken along line I—I in FIG. 3, showing the optical module having a molded resin.
Figure 4B:
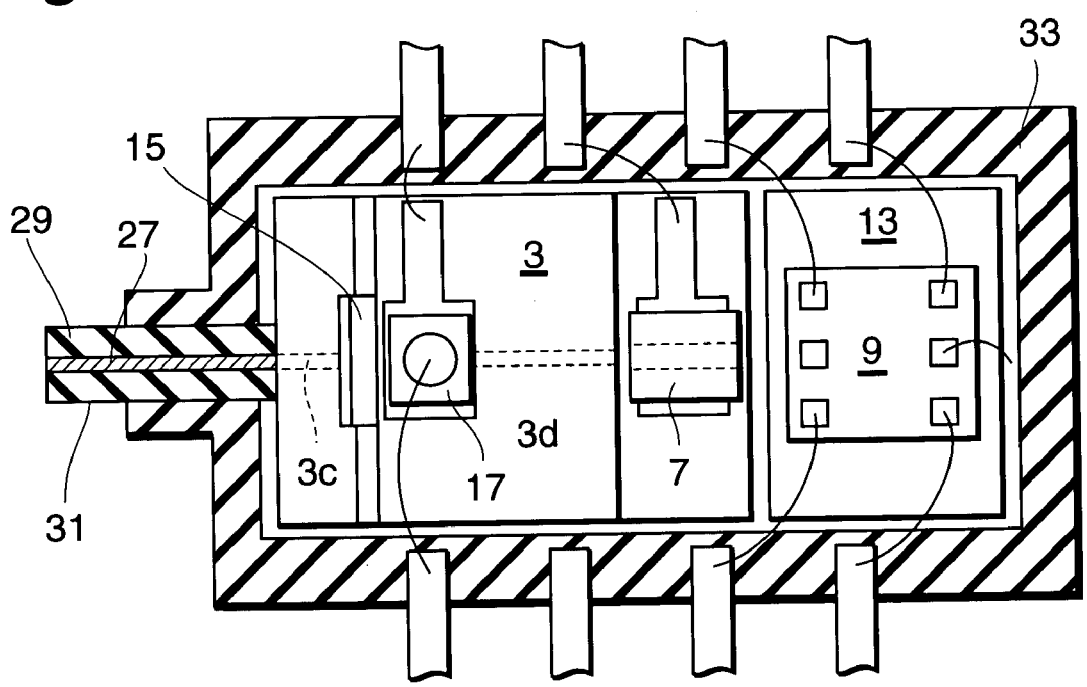
FIG. 4B is a sectional view showing the optical module with the resin partly cut away.

FIG. 3 is a perspective view showing an optical module contained in a sealing resin. FIG. 4A is a cross-sectional view, taken along line I—I in FIG. 3, showing this optical module. FIG. 4B is a cross-sectional view showing the optical module with the resin cut away partly. Referring to FIG. 4A, the substrate product 2a may further comprise a transparent resin 25, an optical device 15 and a light receiving device 17. The transparent resin 25 is provided on the substrate 3 so as to cover the semiconductor light emitting device 7. The transparent resin 25 is made of material through which light emitted by the semiconductor light emitting device 7 can pass. The transparent resin 25 can protect the semiconductor light emitting device 7, optical device 15, and light receiving device 17 from the sealant resin 33 and can maintain the optical coupling among the semiconductor light emitting device 7, the optical device 15 and the light receiving device 17.

Referring to FIG. 3 and FIGS. 4A and 4B, the optical module 1a further comprises a ferrule product 31. The ferrule product 31 includes an optical fiber 27 and a ferrule. The optical fiber 27 is optically coupled to the optical waveguide 3c of substrate product 2a and the ferrule 29 holds the optical fiber 27. The optical module 1a includes the substrate product 2a, the lead frame 21, the ferrule product 31, and the resin 33. The resin 33 serves to protect the substrate 3, semiconductor light emitting device 7, semiconductor driving element 9, and light receiving device 17. The outer shape of the resin 33 is formed by a molding die for the optical module.

Figure 5:
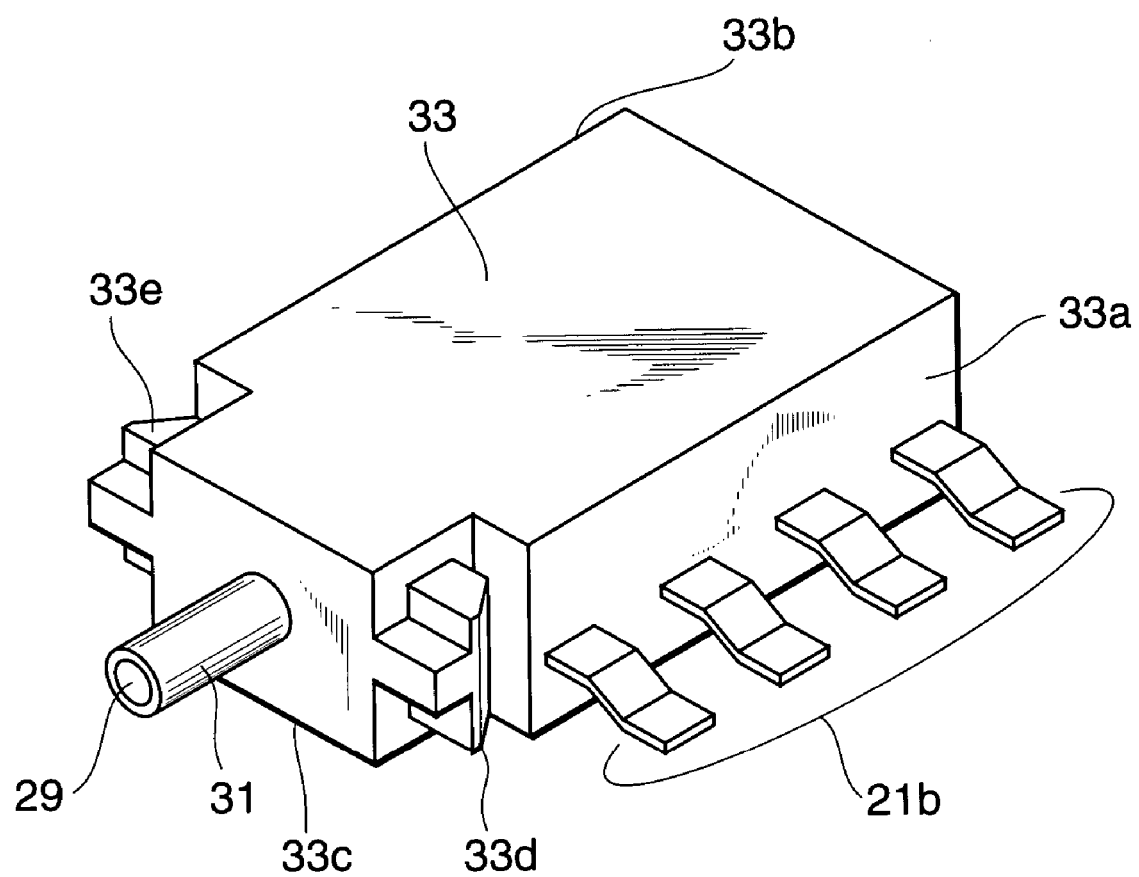
FIG. 5 is a perspective view showing the optical module according to the embodiment.

FIG. 5 is a perspective view showing the optical module in the present embodiment. The optical module 1a has the resin 33, and the lead terminals 21b are arrayed on one side 33a and the opposed side 33b of the resin 33. One end of the ferrule product 31 projects out through the front face 33c of the head portion of the resin 33. The molded resin 33 has projections 33d, 33e, working to engage an optical connector therewith, provided on the both sides of the head part thereof.

(Second Embodiment)

Figure 6:
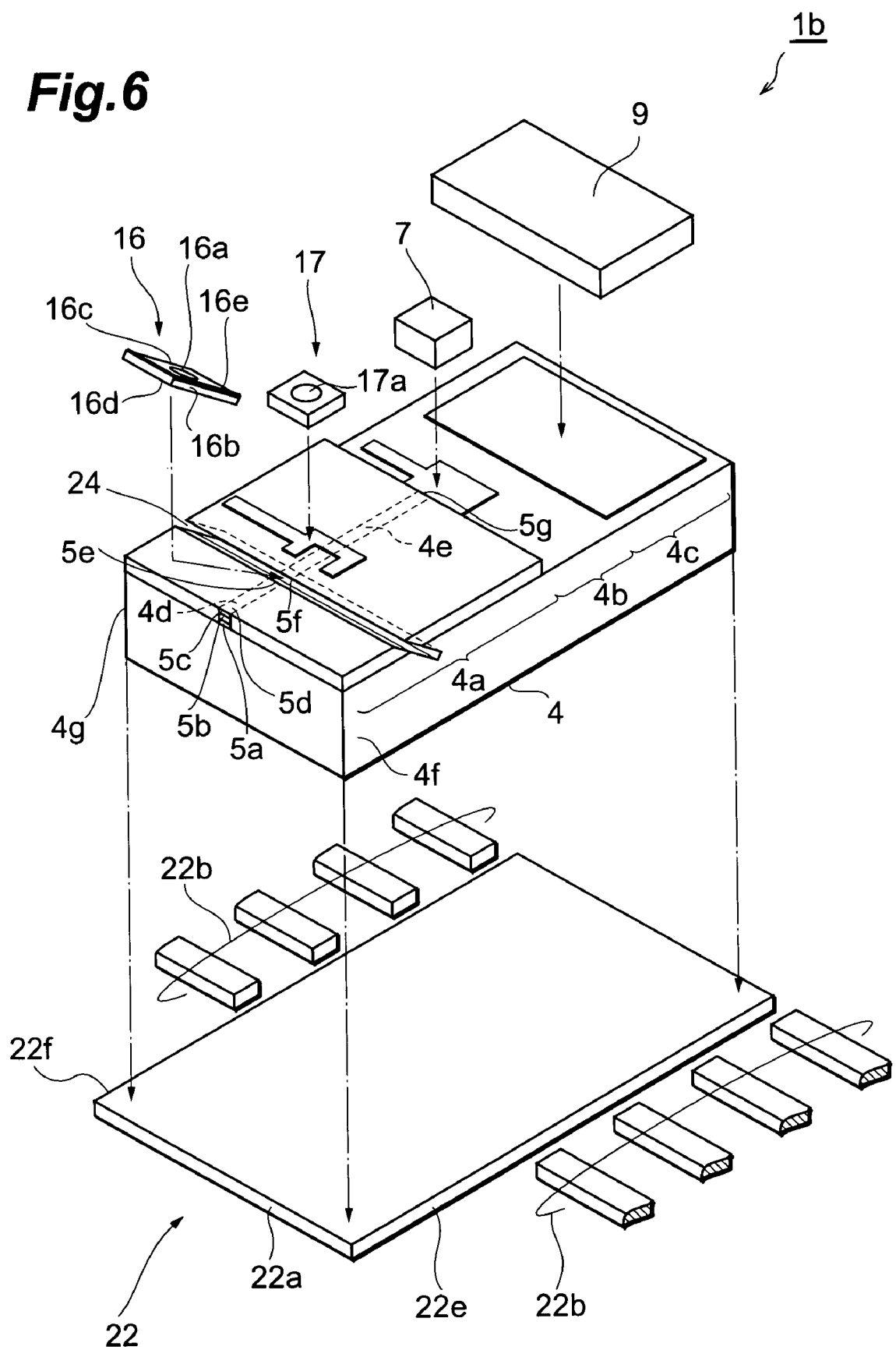
FIG. 6 is a view showing the primary components of the optical module in the second embodiment.
Figure 7:
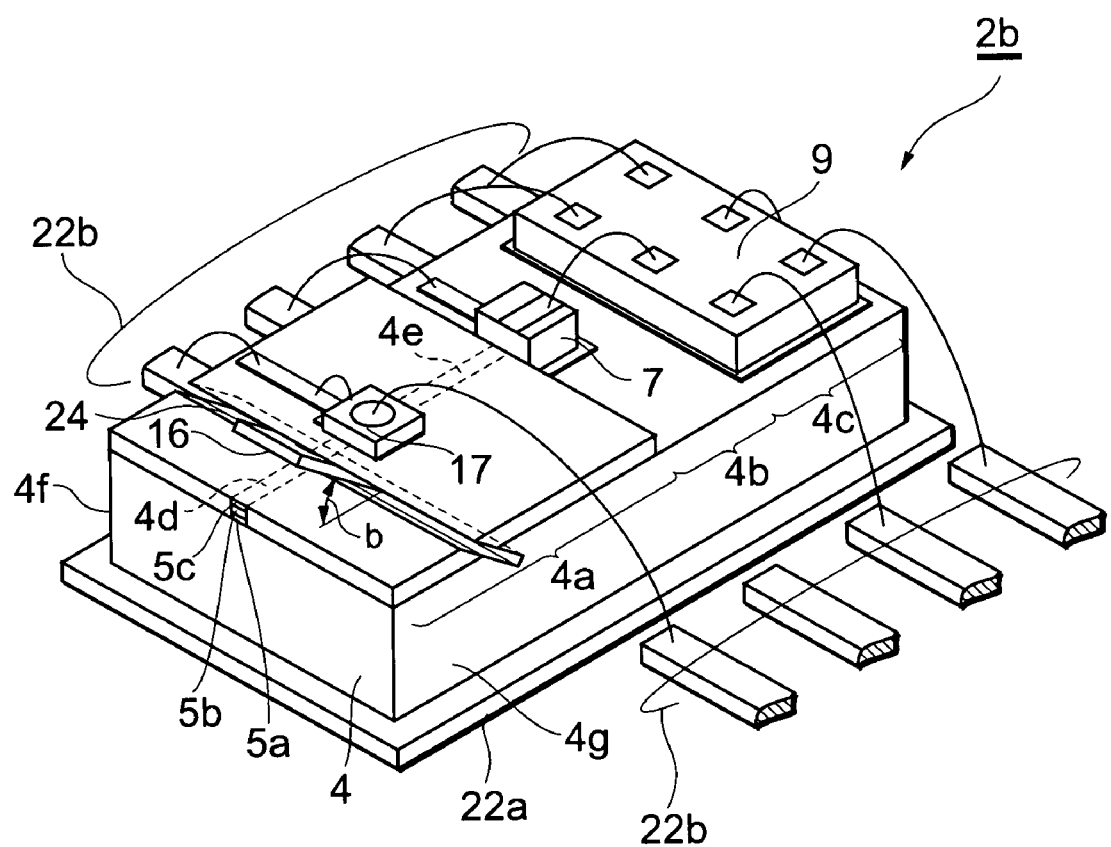
FIG. 7 is a view showing the substrate product of the optical module according to the embodiment.

FIG. 6 is a view showing components of an optical module according to another embodiment of the present invention. FIG. 7 is a view showing a substrate product of the optical module according to the embodiment. Referring to FIGS. 6 and 7, the substrate product 2b in the optical module 1b comprises a substrate 4, a semiconductor light emitting device 7, a semiconductor driving element 9, an optical device 16, and a semiconductor light receiving device 17.

The optical module 1b has the substrate 4 instead of the substrate 3 of optical module 1a. Subsequently, the substrate 4 will be described in detail. The substrate 4 has a first region 4a, a second region 4b, and a third region 4c. The first to third regions 4a, 4b, 4c are arranged in order along a predetermined plane. The substrate 4 may be, for example, a silicon substrate. The substrate 4 has a first optical waveguide 4d and a second optical waveguide 4e. The first and second optical waveguides 4d, 4e are provided in the first region 4a and extend in a direction of a predetermined axis. The first optical waveguide 4d has a pair of ends 5d and 5e, and the second optical waveguide 3e a pair of ends 5f and 5g. The structures of these optical waveguides 4d and 4e may be similar to those of the optical waveguides in the first embodiment. The semiconductor driving element 9 is mounted in the third region 4c of the substrate 4.

In the optical module 1b, the substrate 4 has a groove 24. The structure of the groove 24 may be similar to that in the first embodiment. The groove 24 is positioned with respect to the light receiving element 17a and extends so as to intersect with the optical transmission path constituted by the optical waveguides 4d and 4e. The groove 24 extends from one edge 4f of the pair of edges to the other edge 4g and extends along a reference plane intersecting with the predetermined plane. The reference plane extending along the groove 24 intersects with the primary surface of the substrate 4 so as to make an acute angle β (beta) which the groove 24 forms with the above primary surface of the substrate 4. The optical device 15 is provided in the groove 24. The symbol β (beta) indicating the inclination of the groove 24 shows the angle that the optical element 17a forms with the optical transmission path constituted by the optical waveguides 4d and 4e.

The optical device 16 includes an optical element 16a capable of reflecting a part of incident light and transmitting another part of the incident light. The optical element 16a is provided between the first optical waveguide 4d and the second optical waveguide 4e. The optical element 16a includes a transparent substrate 16b through which the light generated by the semiconductor light emitting element 7a can pass. The transparent substrate 16b has a pair of surfaces 16c and 16d, each extending along a plane intersecting with the predetermined axis. A dielectric multi-layer film 16e is provided on one of the pair of surfaces 16c and 16d. In the optical device 16, one surface 16c transmits one part of the incident light and reflects another part of the incident light. One surface 16c faces one end 5f of the optical waveguide 4e and is optically coupled to one end 5f of optical waveguide 4e. The other surface 16d faces one end 5e of the optical waveguide 4d and is optically coupled to one end 5e of the optical waveguide 4d.

The optical module 1b may further comprise a lead frame 22. The lead frame 22 has an island 22a and a plurality of lead terminals 22b. The lead frame 22 mounts the substrate 4. The substrate 4 is provided on the island 22a in contrast to that of the optical module 1a of the first embodiment. The island 22a has a pair of edges 22e and 22f, some of the lead terminals 22b are arranged such that one ends of the lead terminals 22b face the edge 22e, and others of the lead terminals 22b are arranged such that one ends of the lead terminals 22b face the edge 22f. The lead frame 22 serves to electrically connect the semiconductor light emitting element 7, light receiving element 17, and semiconductor driving element 9 with each other, and to mount the substrate 4.

In the optical module 1b, the light receiving element 17a receives a part of light from the semiconductor light emitting element 7a through the optical waveguide 4e and the optical element 15a. The remaining of the light from the semiconductor light emitting element 7a enters the optical waveguide 4d. The optical device 16 is positioned with respect to the substrate 4, and the semiconductor light receiving device 17 is positioned with respect to the optical device 16 on the substrate 4, so that the optical device 16 can be positioned with respect to the semiconductor light receiving device 17.

Figure 8A:
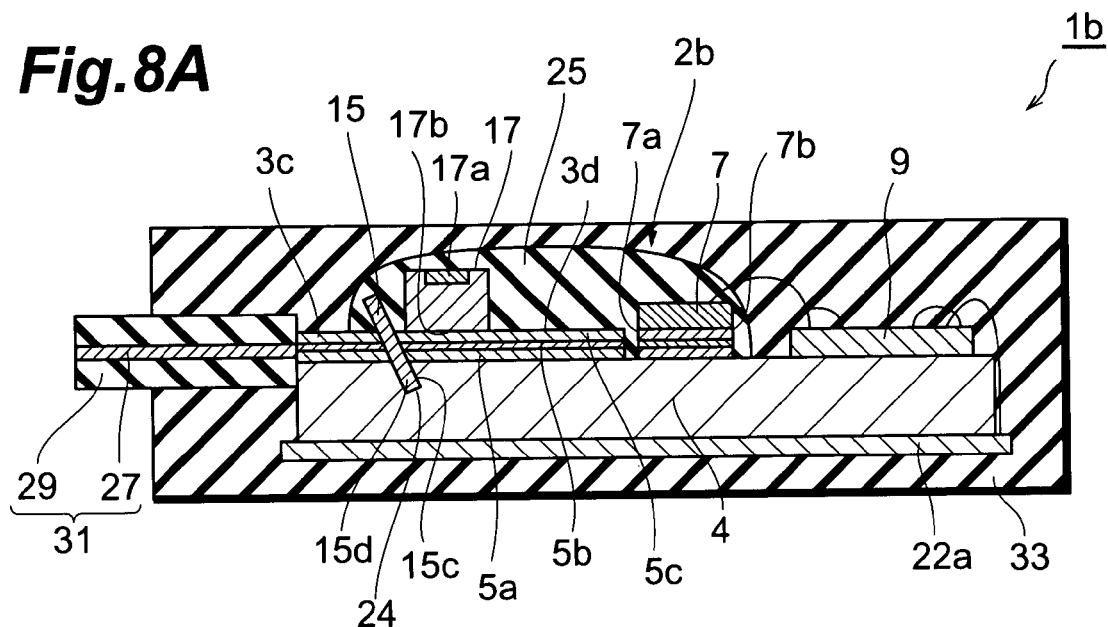
FIG. 8A is a sectional view showing the optical module sealed in the resin body.
Figure 8B:
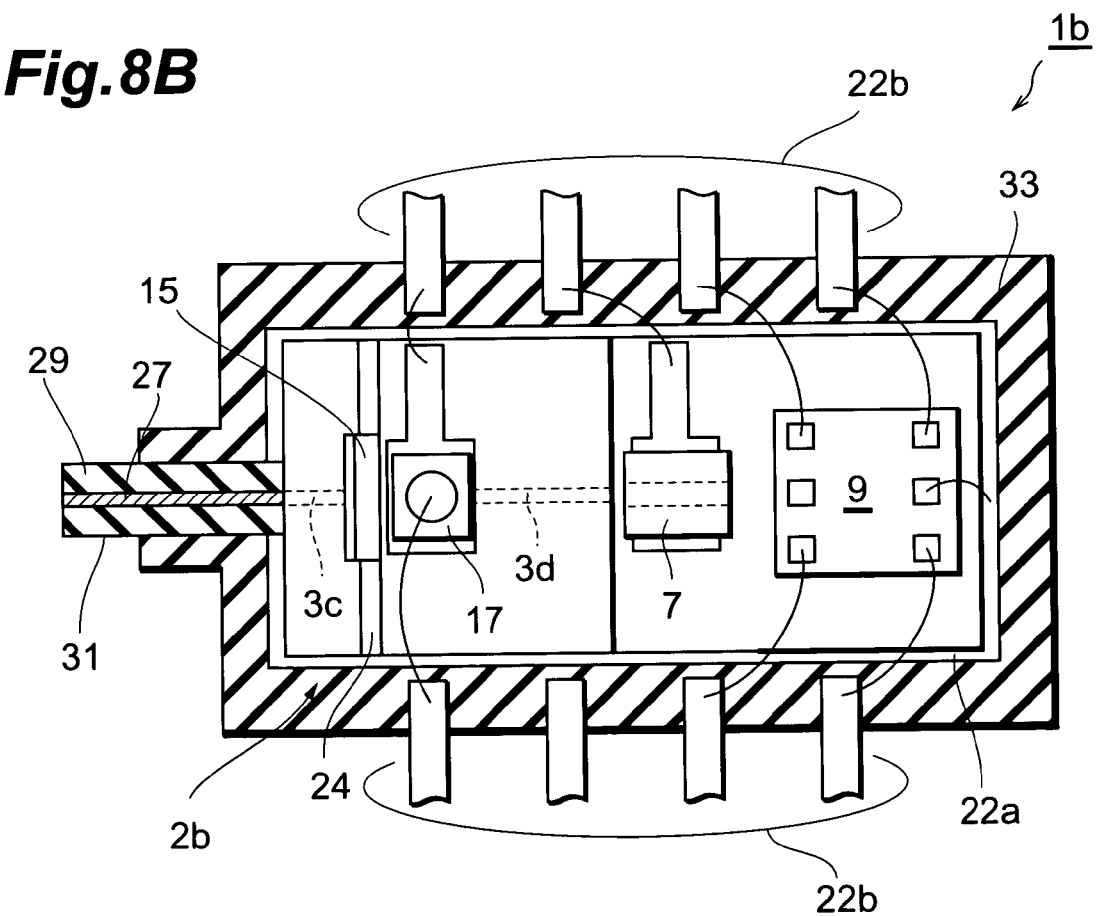
FIG. 8B is another sectional view showing the optical module with the resin body partly cut away.

As shown in FIGS. 8A and 8B, the optical module 1b is also sealed in the resin 33 as in the case of the optical module 1. A ferrule product 31 is optically coupled to the optical waveguide 4d and projects out through one end face of the resin 33.

In the present embodiment, the substrate product 2b can be obtained by mounting the semiconductor light emitting device 7, the semiconductor driving element 9, the optical device 16, and the light receiving device 17 on the substrate 4. This structure can decrease the number of constituent components of the optical module and thus facilitate the assembly of the optical module. The optical module 1b does not need an assembly margin between the substrate and the mount member mounting the semiconductor driving element thereon, so that the distance between the semiconductor driving element 9 and the semiconductor light emitting device 7 can be decreased.

(Third Embodiment)

Figure 9:
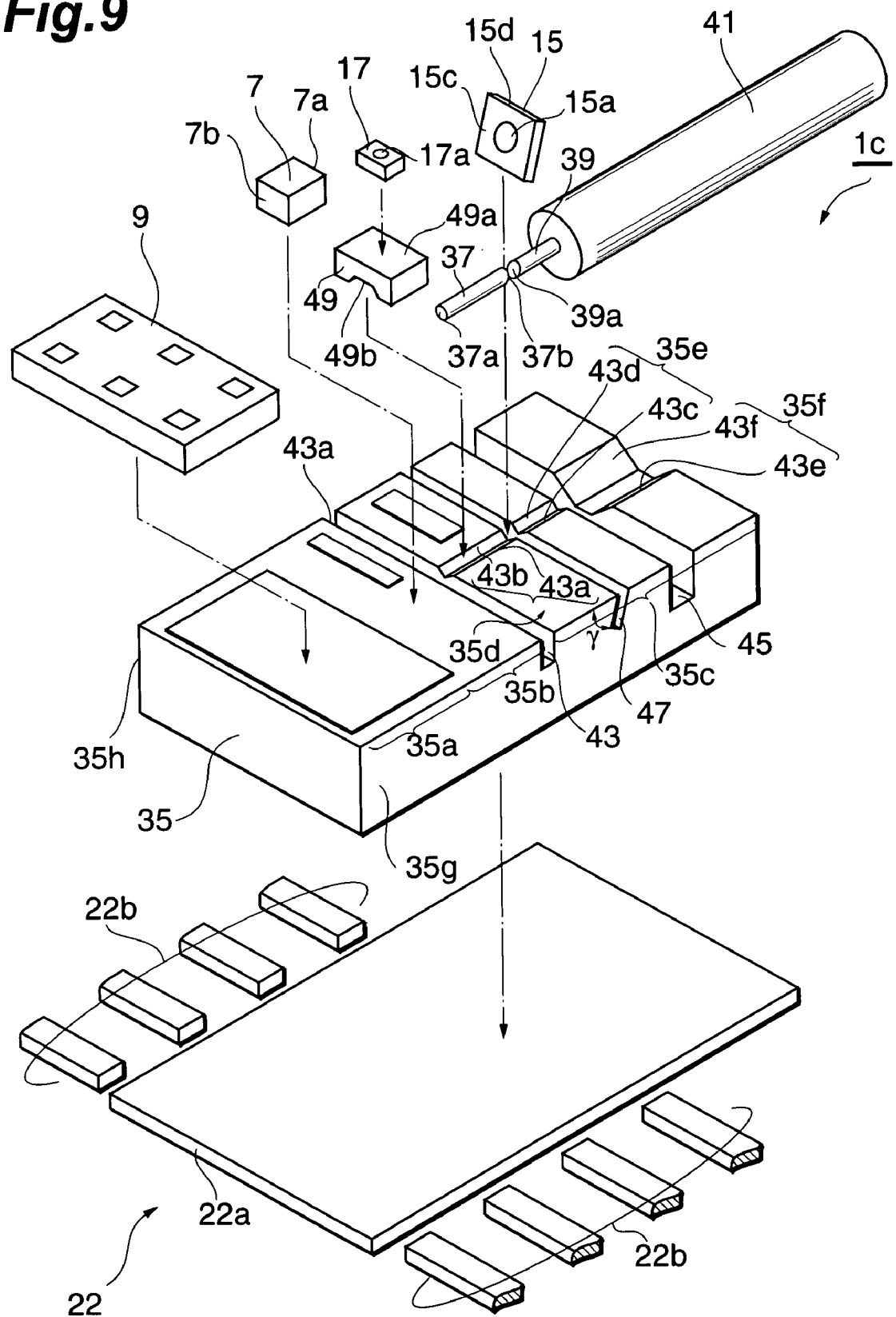
FIG. 9 is a view showing the primary components of the optical module in the third embodiment.
Figure 10:
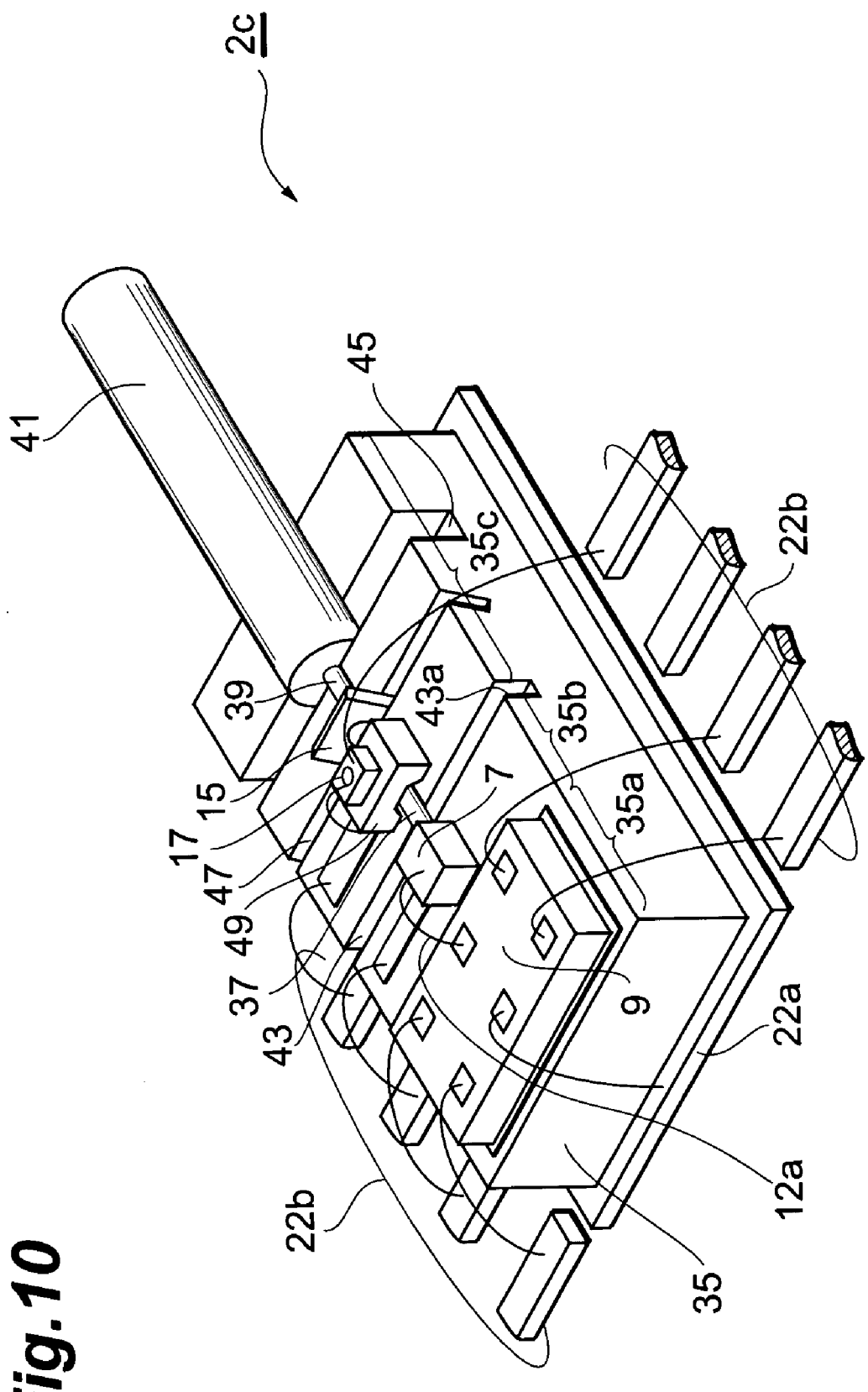
FIG. 10 is a view showing the substrate product of the optical module according to the embodiment.

FIG. 9 is a view showing the components of an optical module in still another embodiment of the present invention. FIG. 10 is a view showing a substrate product of the optical module according to the embodiment. Referring to FIGS. 9 and 10, the substrate product 2c of optical module 1c comprises a substrate 35, a semiconductor light emitting device 5, a semiconductor driving element 9, an optical device 15, a semiconductor light receiving device 17, a first optical fiber 37, and a second optical fiber 39. The second optical fiber 39 is held by ferrule 41.

The substrate 35 has a first region 35a, a second region 35b, and a third region 35c. The first to third regions 35a to 35c are arranged in order along a predetermined plane. The substrate 35 may be, for example, a silicon substrate, as in the first and second embodiments. The substrate 35 comprises a support groove 35d for supporting the first optical fiber 37, a support groove 35e for supporting the second optical fiber 39, and a support groove 35f for ferrule 41. In the substrate 35, the support groove 35d, the support groove 35e, and the support groove 35f extend in the direction of a predetermined axis. The support groove 35d has a first support face 43a and a second support face 43b. The support groove 35e has a third support face 43c and a fourth support face 43d. The support groove 35f has a fifth support face 43e and a sixth support face 43f. These support grooves can be formed, for example, by use of a silicon wafer together with a photolithography technology and a wet etching technology.

The substrate 35 has a groove 43 provided between the second region 35b and the third region 35c. The groove 43 extends from one side of a pair of sides 35g and 35h to the other side. The groove 43 has an abutting face 43a provided at one end of support groove 35d. The abutting face 43a intersect with the predetermined axis. One end 37a of optical fiber 37 is provided in the groove 43 so as to abut against the abutting face 43a. The substrate 35 has a groove 45 provided between the support groove 35e and the support groove 35f.

In the optical module 1c, the substrate 35 has a groove 47 provided between the support groove 35d and the support groove 35e. The groove 47 is positioned with respect to the light receiving element 17a and extends so as to intersect with the optical transmission path constituted by the optical fibers 37 and 39. The groove 47 extends from one side of the pair of sides 35g and 35h to the other side and extends along a reference plane intersecting with the primary surface of the substrate 35. The optical device 15 is inserted in the groove 47. The symbol γ (gamma) indicating the inclination of the groove 47 γ defined by an angle which the light entrance surface of the optical element 15a forms with the optical transmission path constituted by the optical fibers 37 and 39. In the present embodiment, the groove 47 makes an acute angle with the primary surface of substrate 35.

The semiconductor light emitting device 7 includes a semiconductor light emitting element 7a and is provided in the second region 35b of the substrate 35. The semiconductor light emitting device 7 has a pair of end faces 7a and 7b and one end face 7a is optically coupled to one end 37a of the optical fiber 37 abutting against the face 43a.

The semiconductor driving element 9 is mounted on the first region 35a. The semiconductor driving element 9 is electrically connected through a connecting member 12a, such as a bonding wire, to the semiconductor light emitting element 7a.

In the optical device 15, the optical element 15a is provided between the first optical fiber 37 and the second optical fiber 39. The optical element 15a has a pair of surfaces 15c and 15d, each extending along a plane intersecting with the predetermined axis. One surface 15c transmits one part of the incident light and reflects another part of the incident light. One surface 15c faces one end 37b of the optical fiber 37 and is optically coupled to one end 37b of the optical fiber 37. The other surface 15d faces one end 39a of the optical fiber 39 and is optically coupled to one end 39a of the optical fiber 39.

The semiconductor light receiving device 17 includes a light receiving element 17a. The light receiving element 17a is mounted in the second region 35c so as to be optically coupled to the optical element 15a. The semiconductor light receiving device 17 is mounted on the mount component 49 and is located above the optical fiber 37. Namely, the optical fiber 37 is located between the semiconductor light receiving device 17 and the substrate 35. The mount component 49 serves as a securing member which can be used to secure the optical fiber 37. The light receiving element 17a receives a part of light from the semiconductor light emitting element 7a through the optical fiber 37, the optical element 15a and the mount component 49. The remaining of the light from semiconductor light emitting element 7a is supplied to optical fiber 39. The optical device 15 is positioned with respect to the substrate 35, and the semiconductor light receiving device 17 is positioned with respect to the substrate 35, so that the semiconductor light receiving device 17 is positioned with respect to the optical device 15.

The optical fiber 37 is located between the mount component 49 and the substrate 35. The mount component 49 is made of material through which light emitted by the semiconductor light emitting device 7 can pass. The mount component 49 comprises a surface 49a and a positioning surface 49b. The surface 49a is provided for mounting of the semiconductor light receiving device 17, and the positioning surface 49b is provided for positioning the optical fiber 37. The light receiving element 17a is provided such that the light entrance surface 17b thereof is directed toward the mount surface 49a.

The light receiving element 15a is provided in the third region 35c of the substrate 35 and the semiconductor driving element 9 is provided in the first region 35a of substrate 35, so that the distance between the semiconductor driving element 9 and the semiconductor light emitting element 7 can be shortened and the light receiving element 17a can receive the forward light of semiconductor light emitting element 7a through optical fiber 37.

Figure 11A:
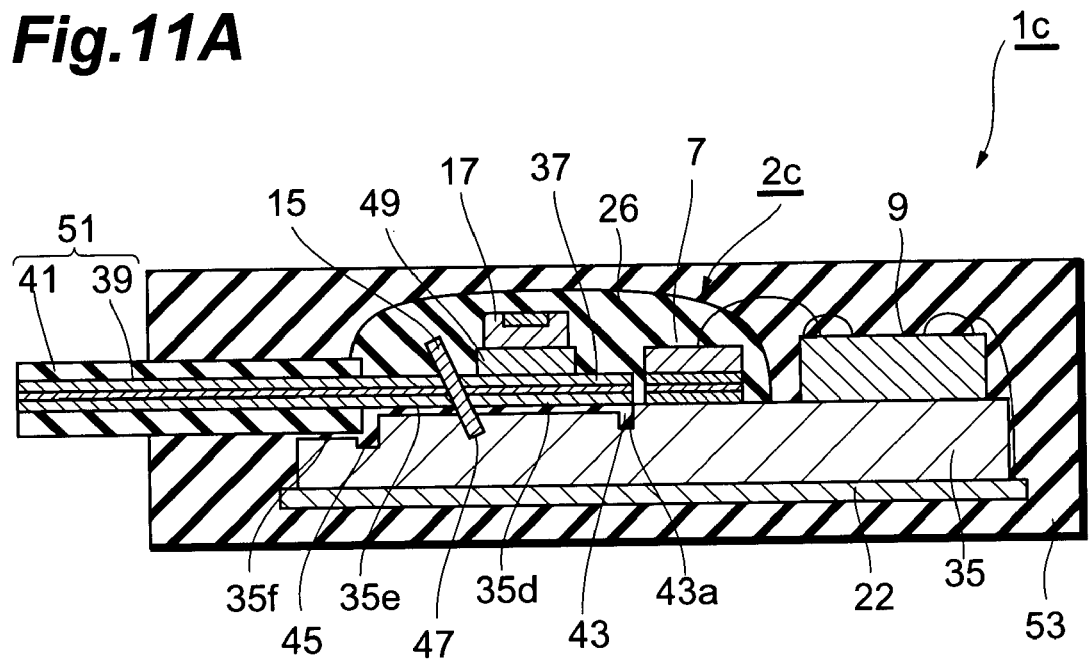
FIG. 11A is a sectional view showing the optical module sealed in the resin body.
Figure 11B:
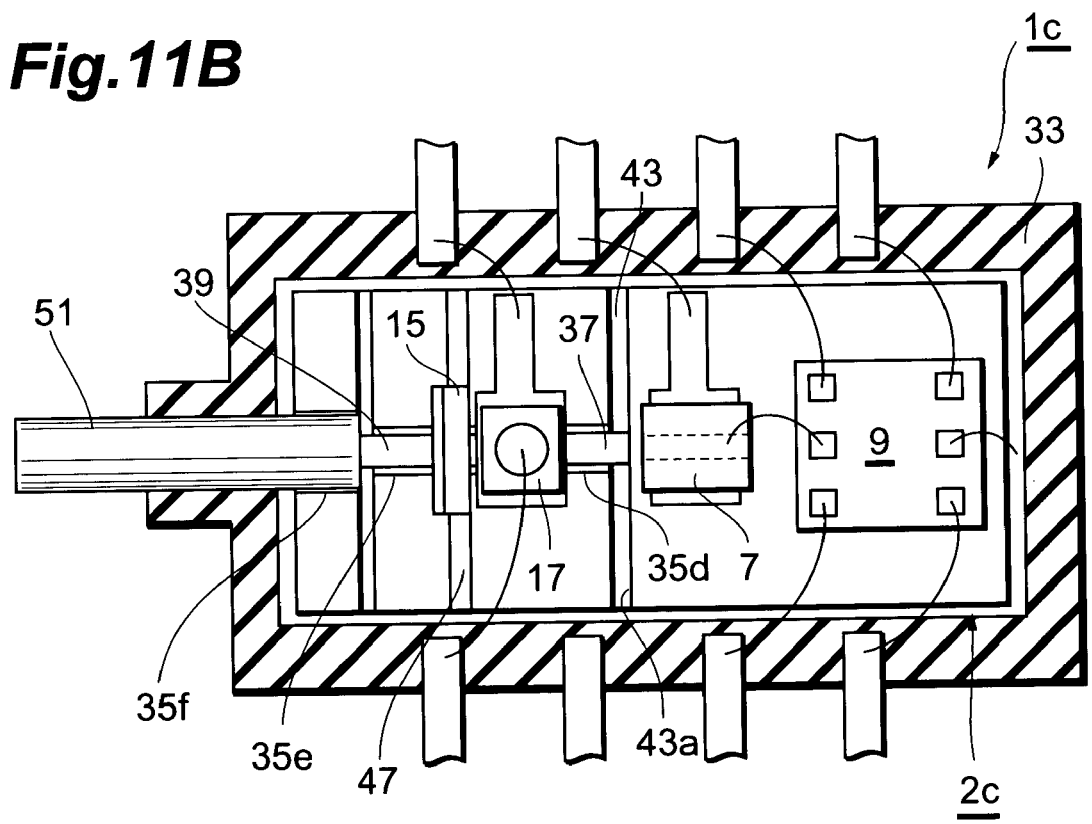
FIG. 11B is another sectional view showing the optical module with the resin body partly cut away.

FIG. 11A is a sectional view showing an optical module sealed with a resin. FIG. 11B is another sectional view showing the optical module with the sealing resin of the optical module partly cut away. Referring to FIGS. 11A and 11B, the substrate product 2c may further comprise a transparent resin 26 through which light emitted by the semiconductor light emitting device 7 can pass, as in the case of the optical modules in the first and second embodiments. The transparent resin 26 of the substrate product 2c is provided on the substrate 35 so as to cover the semiconductor light emitting device 7, the optical device 15, and the light receiving device 17.

Referring to FIGS. 11A and 11B, the optical module 1c comprises a substrate product 2c, a lead frame 22, a ferrule product 51, and a resin 53. The ferrule product 51 includes an optical fiber 39 and a ferrule 41.

Figure 12A:
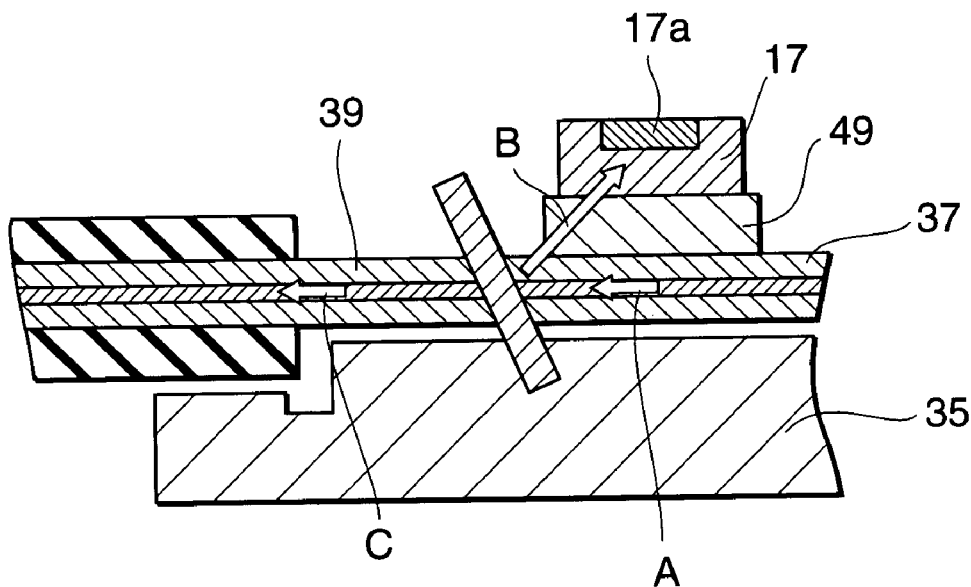
FIG. 12A and FIG. 12B are views showing the optical device and the semiconductor light receiving device.
Figure 12B:
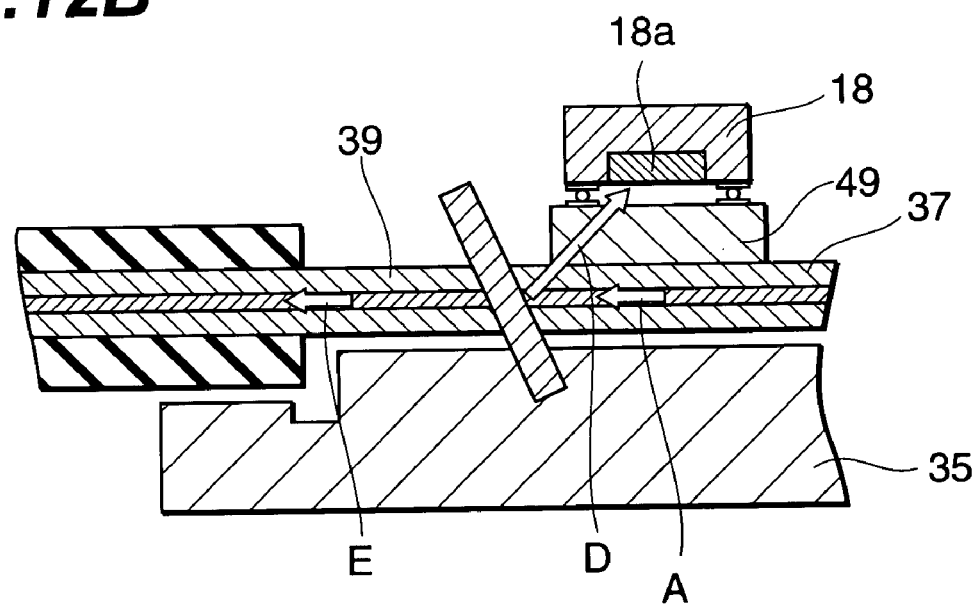

FIGS. 12A and 12B are views showing the optical coupling among the optical fibers, the optical device, and the semiconductor light receiving device. With reference to FIG. 12A, the semiconductor light receiving device 17 can be a back illuminated type photodiode. The light "A" from semiconductor light emitting element 7a travels through the optical fiber 37 and then enters the optical element 15a. A part of the light "A" becomes light "B" traveling through the mount component 49 into the light receiving element 17a. The remaining of the light "A" becomes light "C" traveling through the optical element 15a into the optical fiber 39. Referring to FIG. 12B, the semiconductor light receiving device 18 can be a front illuminated type photodiode. The light "A" from semiconductor light emitting element 7a travels through the optical fiber 37 and then enters the optical element 15a. A part of the light "A" becomes light "D" traveling through the mount component 49 through which the light "A" can pass, and then enters the light receiving element 18a. The remaining of the light "A" becomes light "E" that travels through the optical element 15a and then enters the optical fiber 39. For example, the distance between the semiconductor light receiving device 17 and the optical element 15a in FIG. 12A can be greater than the distance between the semiconductor light receiving device 18 and the optical element 15a in FIG. 12B. The mount component 49 can be used for securing the optical fiber.

Figure 13A:
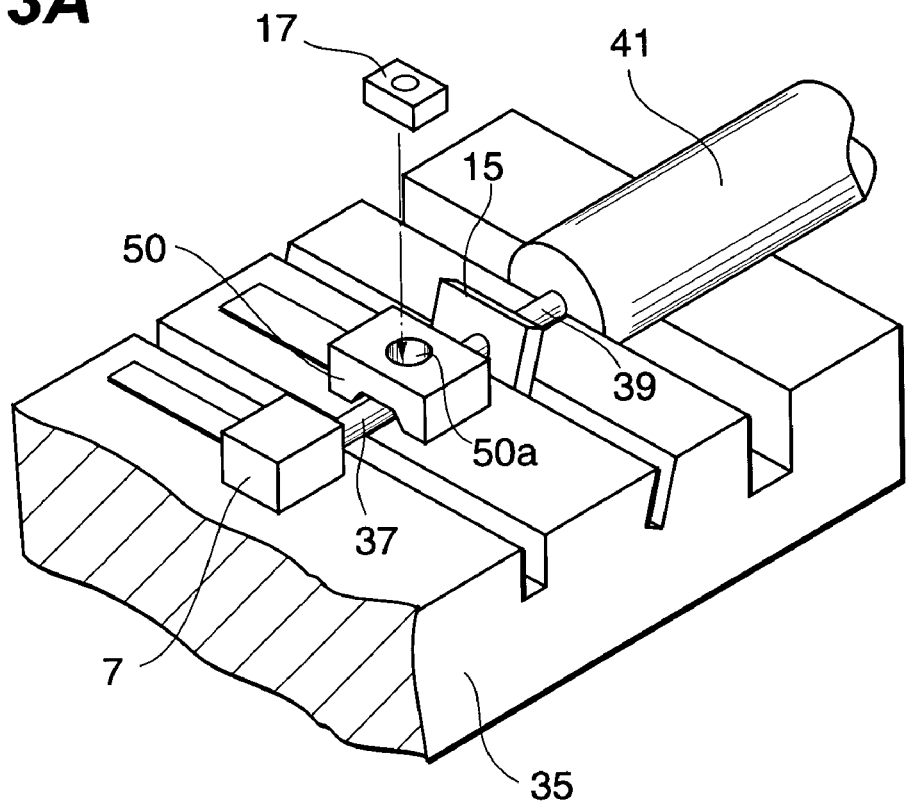
FIG. 13A and FIG. 13B are views showing a modification of the securing member.
Figure 13B:
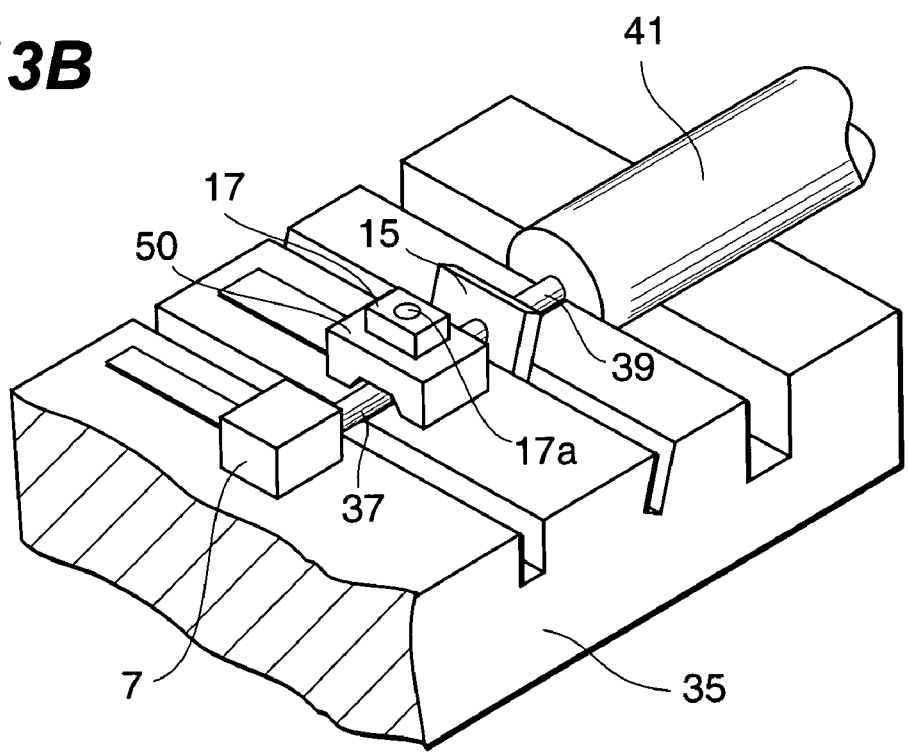

FIGS. 13A and 13B are views showing a modification of the mount component. Referring to FIG. 13A, the mount component 50 has an aperture 50a. The aperture 50a is positioned to the light receiving element of the semiconductor light receiving device. Light from semiconductor light emitting element 7a travels via the optical fiber 37, optical element 15a, and aperture 50a and then enters the light receiving element 17a. The mount component 50 obviates the necessity of the mount component 50 made of material that can transmit light from the semiconductor light emitting element 7a. The mount component 50 can be used for securing the optical fiber.

In the present embodiment, although the semiconductor driving element 9 is mounted on the substrate 35, the semiconductor driving element 9 can be mounted on the mount member 13 as shown in the first embodiment.

The substrate 35 has some grooves, intersecting with the direction in which the optical fibers extend, in addition to the support grooves These grooves can be formed, for example, with a dicing tool.

(Fourth Embodiment)

Figure 14A:
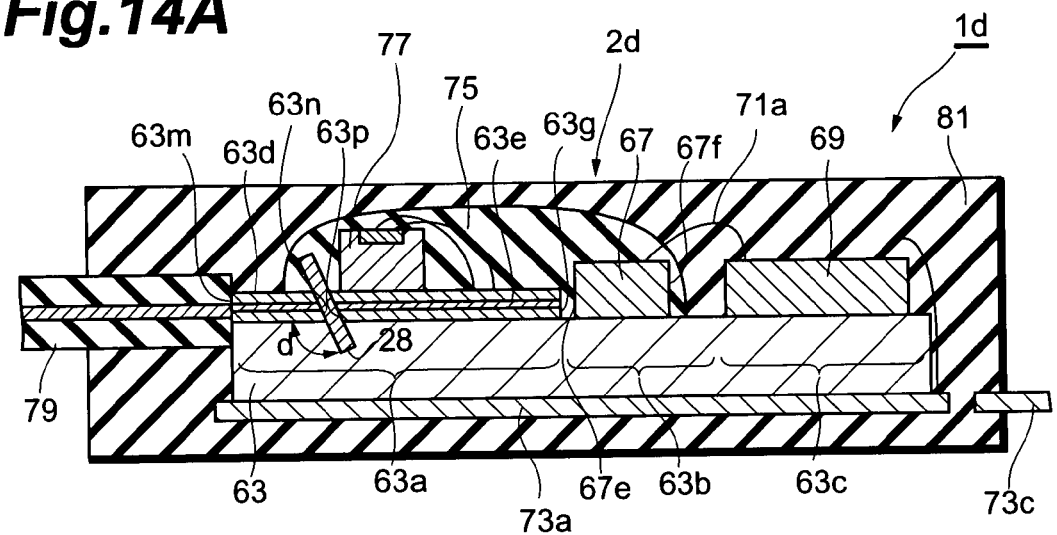
FIG. 14A is a sectional view showing the optical module having a resin for molding.
Figure 14B:
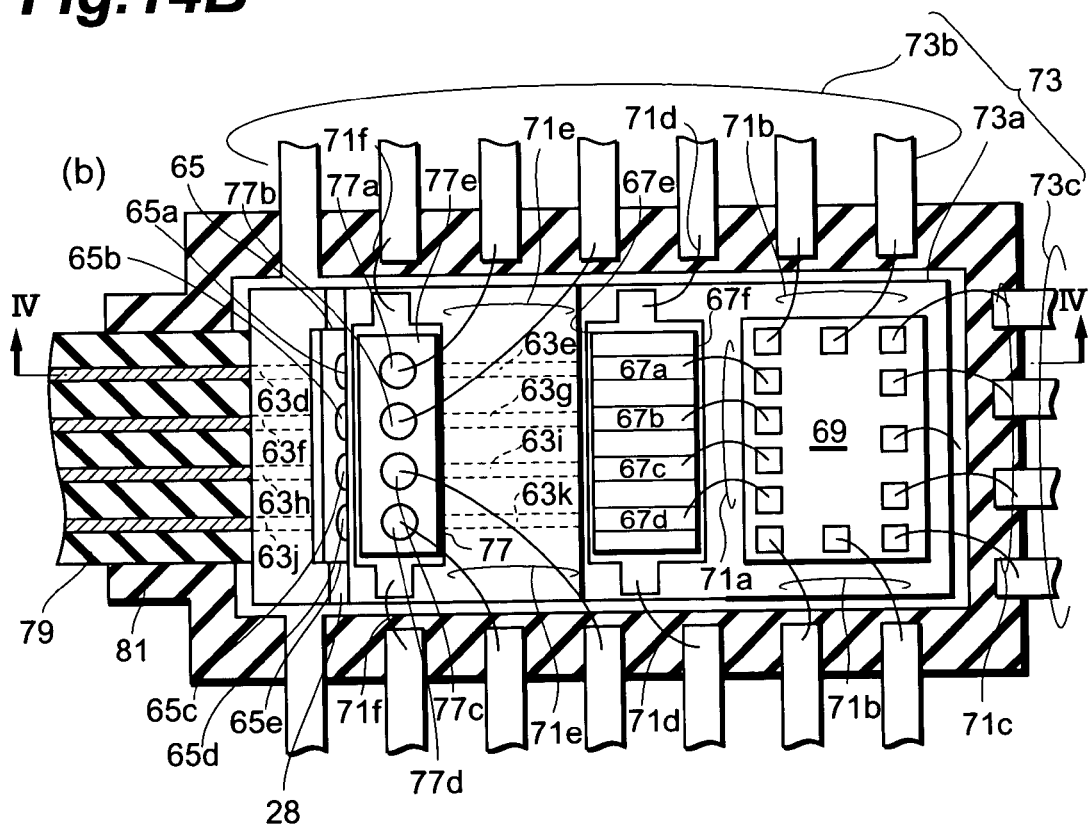
FIG. 14B is a sectional view showing the optical module with the resin partly cut away.

FIG. 14A is a sectional view showing a resin-molded optical module. FIG. 14B is another sectional view showing the optical module with the resin of the optical module partly cut away. Referring to FIGS. 14A and 14B, the substrate product 2d of optical module 1d comprises a substrate 63, a semiconductor light emitting device 67, a semiconductor driving element 69, an optical device 65, and a semiconductor light receiving device 77.

The substrate 63 has a first region 63a, a second region 63b, and a third region 63c. The first to third regions 63a, 63b, 63c are arranged in order along a predetermined plane. The substrate 63 may be, for example, a silicon substrate. The substrate 63 has a first optical waveguide 63d and a second optical waveguide 63e, a third optical waveguide 63f and a fourth optical waveguide 63g, a fifth optical waveguide 63h and a sixth optical waveguide 63i, and a seventh optical waveguide 63*j* and an eighth optical waveguide 63*k*. The first to eighth optical waveguides 63*d* to 63*k* are provided in the first region 63*a* and each of these optical waveguides 63*d* to 63*k* extends in a direction of a first axis. The first optical waveguide 63*d* and second optical waveguide 63*e*, the third optical waveguide 63*f* and fourth optical waveguide 63*g*, the fifth optical waveguide 63*h* and sixth optical waveguide 63*i*, and the seventh optical waveguide 63*j* and eighth optical waveguide 63*k* are arranged in order in a direction of a second axis perpendicular to the first axis.

The description hereinafter concerns the first optical waveguide 63*d* and second optical waveguide 63*e*, but the other optical waveguides 63*f* to 63*k* also have structures similar thereto. The first optical waveguide 63*d* has a pair of ends 63*m* and 63*n*, and the second optical waveguide 63*e* has a pair of ends 63*p* and 63*q*. The structures of these optical waveguides 63*d* and 63*e* may be similar to those of the optical waveguides in the first embodiment. The semiconductor driving element 69 is mounted in the third region 63*c* of the substrate 63.

The semiconductor light emitting device 67 is provided in the second region 63*b* of the substrate 63 and includes a plurality of semiconductor light emitting elements 67*a* to 67*d*. These semiconductor light emitting elements can be, for example, semiconductor laser elements or semiconductor optical amplifiers. Although the description hereinafter concerns the semiconductor light emitting element 67*a*, the other semiconductor light emitting elements 67*b* to 67*d* also have a similar structure. The semiconductor light emitting element 67*a* has a pair of end faces 67*e* and 67*f*, and one end face 67*e* is optically coupled to one end 63*q* of the optical waveguide 63*e*. The optical reflectivity of one end face 67*e* is smaller than that of the other end face 67*f*. If the semiconductor light emitting element 67*a* works as a semiconductor laser element, the pair of end faces 67*e* and 67*f* constitute an optical cavity.

The semiconductor driving element 69 is provided in the third region 63*c* of the substrate 63. The semiconductor driving element 69 is electrically connected through connecting members 71*a*, such as bonding wires, to the semiconductor light emitting elements 67*a* to 67*d*, respectively. The semiconductor driving element 69 receives a pair of electric signals for each of the semiconductor light emitting elements 67*a* to 67*d* and generates a single drive signals for each of the semiconductor light emitting elements 67*a* to 67*d* from the pair of electric signals. The single drive signal is applied to each of the semiconductor light emitting elements 67*a* to 67*d*.

The optical device 65 includes optical elements 65*a* to 65*d* that can reflect a part of incident light and transmitting a part of the incident light. The optical elements 65*a* to 65*d* are provided on single substrate 65*e* and are aligned with the locations of the optical waveguides on the substrate 63, respectively. Each of the optical elements 65*a* to 65*d* may have the structure of the optical element 15*a* in the first embodiment or the optical element 16*a* in the second embodiment, but is not limited to this structure.

In the optical module 1*d*, the substrate 63 has a groove 28 of a structure similar to that in the first embodiment. The groove 28 is positioned with respect to the light receiving device 77 and extends so as to intersect with an optical transmission path constituted by the optical waveguides 63*d* and 63*e* (similarly, with optical transmission paths constituted by the other optical waveguides). The reference plane extending along the groove 28 intersects with the primary surface of the substrate 63 so as to make an obtuse angle δ (delta) therewith. The optical device 65 is provided in the groove 28. The symbol δ (delta) showing the inclination of the groove 28 indicates an angle between the optical element 65*a* and the optical transmission path.

The semiconductor light receiving device 77 is mounted in the first region 63*a*. The semiconductor light receiving device 77 includes light receiving elements 77*a* to 77*d*. The light receiving elements 77*a* to 77*d* are arranged to be optically coupled to the optical elements 65*a* to 65*d*, respectively. Each of the light receiving elements 77*a* to 77*d* may have a structure equivalent or similar to the light receiving elements used in the optical modules in the first to third embodiments, but is not limited to this. The semiconductor light receiving device 77 has a single substrate 77*e* and the light receiving elements 77*a* to 77*d* are provided in the substrate 77*e*. The locations of these light receiving elements 77*a* to 77*d* are aligned with those of the optical waveguides on the substrate 63. The optical device 65 is positioned with respect to the substrate 63, and the semiconductor light receiving device 77 is positioned with respect to the substrate 63. As a consequence, the semiconductor light receiving device 77 is positioned with respect to the optical device 65.

In the substrate product 2*d* and optical module 1*d* of the present embodiment, the light receiving element 77*a* is provided on the first region 63*a* of substrate 63 and the semiconductor driving element 69 in the third region 63*c* of substrate 63, so that the distance between the semiconductor driving element 69 and the semiconductor light emitting device 67 can be shorten and the light receiving elements of semiconductor light receiving device 77 receives the forward light of the semiconductor light emitting elements of the semiconductor light emitting device 67 through the optical waveguides in substrate 63 and via the optical elements of the optical device 65, respectively.

The optical module 1*d* may further comprise a lead frame 73. The lead frame 73 has an island 73*a* and a plurality of lead terminals 73*b* and 73*c*. The island 73*a* is provided for mounting the substrate 63. The lead terminals 73*b* and 73*c* are located on three sides of the primary surface of the island 73*a*. The lead frame 73 serves to make electrical connections among the semiconductor light emitting device 67, the light receiving device 77, and the semiconductor driving element 69. Also, the lead frame 73 serves to mount the substrate 63.

The semiconductor driving element 69 is connected through a pair of connecting members 71*b* and 71*c*, such as bonding wires, to the lead terminals 73*b*. Each semiconductor light emitting element of the semiconductor light emitting device 67 has an anode and a cathode. One of the anode and cathode receives a drive signal from the semiconductor driving element 69 through the connecting member 71*a* and receives power through the connecting members 71*d*. Each light receiving element of the semiconductor light receiving device 77 has an anode and a cathode. One of the anode and cathode provides a photocurrent through the connecting member 71*e* and receives power through the connecting members 71*f*.

With reference to FIGS. 14A and 14B, the substrate product 2*a* may further comprise a transparent resin 75 provided on the substrate 63 so as to cover the semiconductor light emitting device 67, the optical device 65, and the light receiving device 77. The transparent resin 75 is made of material through which light emitted by the semiconductor light emitting device 67 can pass. The transparent resin 75 can protect the semiconductor light emitting device 67, the optical device 65, and the light receiving device 77 from the sealant resin and can maintain the optical coupling among the semiconductor light emitting device 67, the optical device 65, and the light receiving device 77. The optical module 1d comprises an optical fiber ribbon 79 optically coupled to the optical waveguide 63d, 63f, 63h, 63j of the substrate product 2d. The optical module 1d comprises the substrate product 2d, the lead frame 73, the optical fiber ribbon 79, and the molded resin 81. The resin 81 serves to protect the substrate 63, the semiconductor light emitting device 67, the semiconductor driving element 69, and the light receiving device 77. The outer shape of the resin 81 can be formed by a molding die for the optical module.

Figure 15:
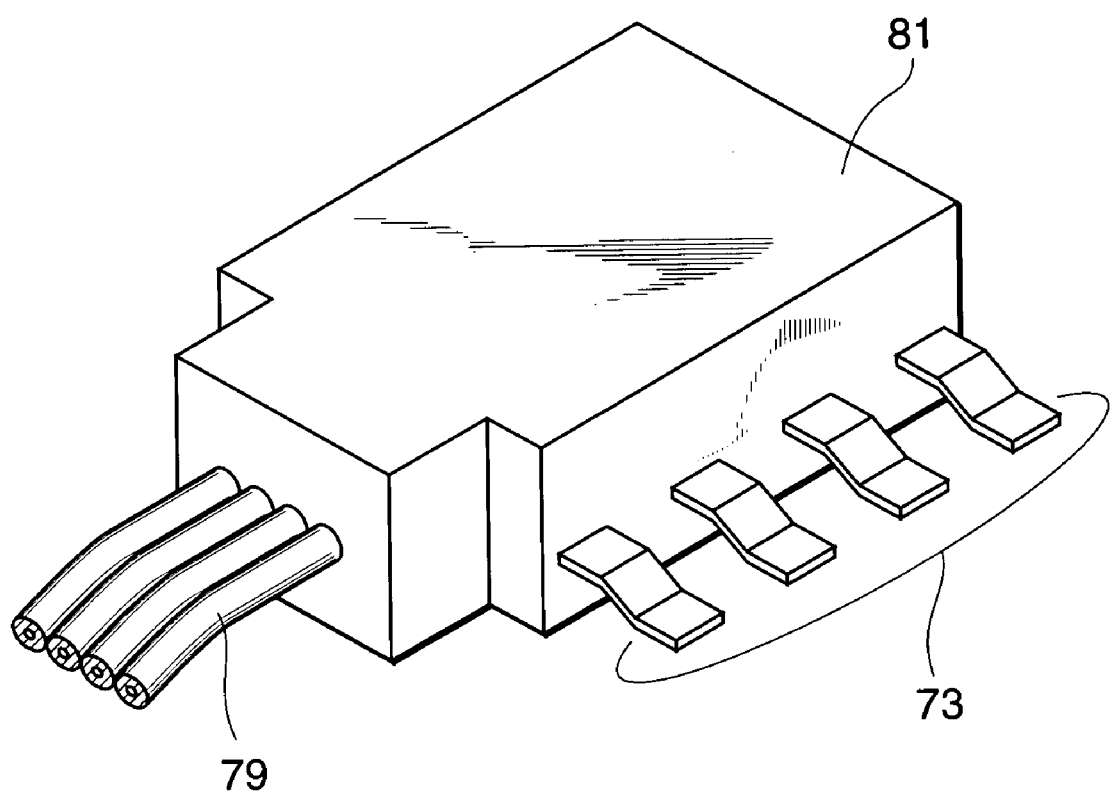
FIG. 15 is a view showing an optical module having a multi-channel structure.

The optical module 1d is sealed in the resin 81. Referring to FIG. 15, the optical fiber ribbon 79, optically coupled to the optical waveguides 63d, 63f, 63h, 63j, projects out through one end face of resin body 81.

In the present embodiment of the substrate product 2d, the semiconductor light emitting device 67, the semiconductor driving element 69, the optical device 65, and the light receiving device 77 are mounted on the substrate 63. This structure can decrease the number of constituent components for the optical module and facilitate the assembly of the optical module. Since there is no need for an assembly margin between the substrate and the mount member that mounts the semiconductor driving element, the optical module 1d can decrease the distance between semiconductor driving element 69 and semiconductor light emitting device 67.

Figure 16:
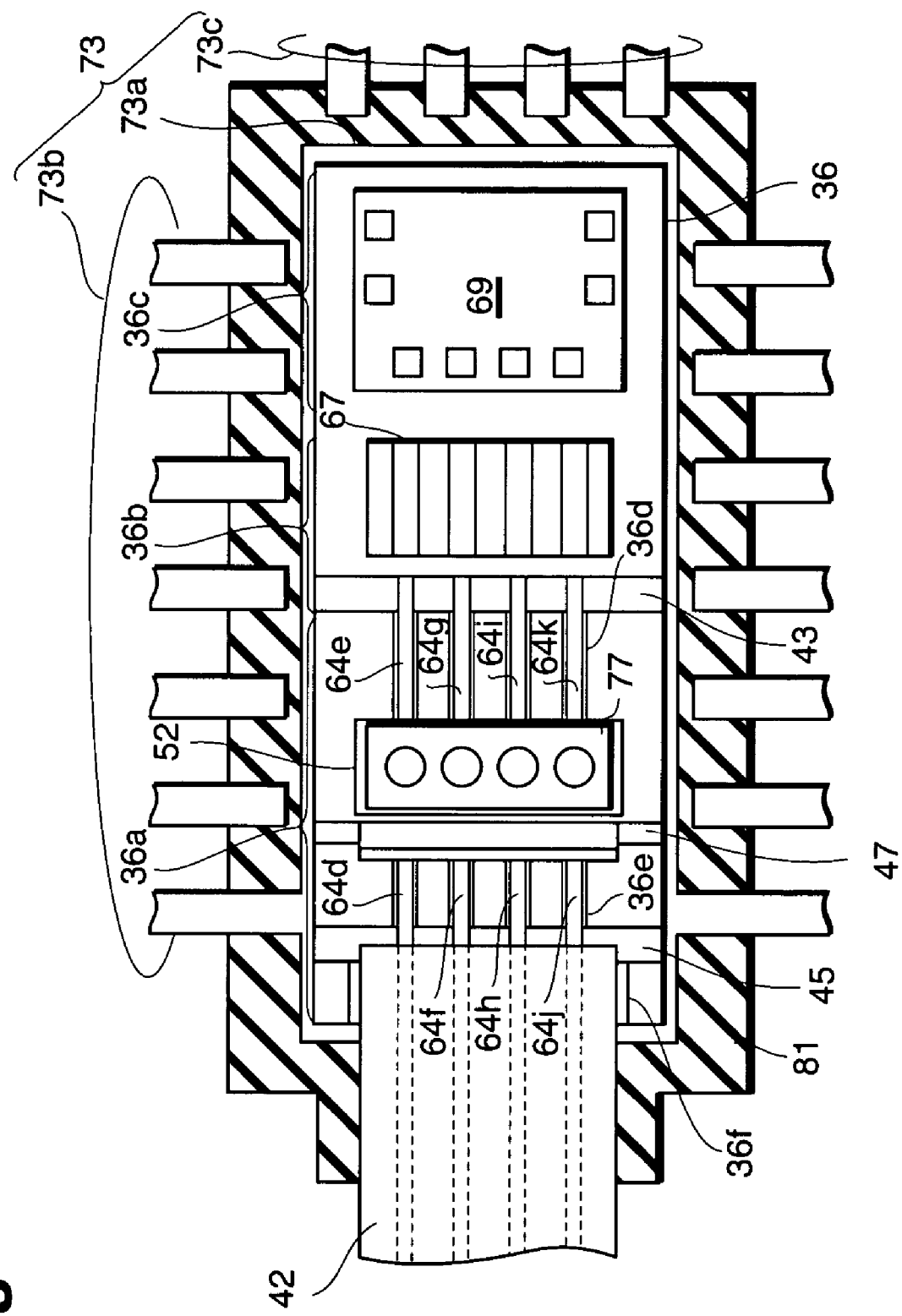
FIG. 16 is a view showing a multi-channel optical module having optical fibers.

The substrate includes the optical waveguides in the present embodiment, and it is thought by a person skilled in the art from the embodiments described before the present embodiment that the substrate 36 having a plurality of grooves 36d, 36e for supporting optical fibers 64d to 64k, as shown in FIG. 16, can be used instead of the substrate 63 in the present embodiment. The substrate 36 also has first to third regions 36a to 36c arranged along the predetermined axis, as in the above-described embodiment. The optical fibers 64d, 64f, 64h, 64j are held by ferrule 42 and the ferrule 42 is located in groove 36f. The illustration of the connecting members, such as bonding wires, is omitted from FIG. 16 for simplicity.

In the optical module and substrate product of the present embodiment, as described above, when the amount of the forward light of the semiconductor light emitting device (e.g., 1 milliwatt) and the optical reflectivity R of the optical device (e.g., 10 percent) are estimated, the output photocurrent of the light receiving device (e.g., 100 microamperes) is determined independent of the optical reflectivity of the back surface of the semiconductor light emitting device. Namely, the monitoring photocurrent value is stabilized.

In the optical module and substrate product of the present embodiment, although the forward light of the semiconductor light emitting device fluctuates with change in ambient temperature even under an APC operation in response to the monitor current from the semiconductor light receiving device, the optical module and substrate product of the present embodiment decreased the tracking error due to the fluctuation of the forward light.

In optical modules and substrate products used heretofore by the present inventors, monitor current from a monitoring photodiode varies in the range of approximately one order of magnitude (for example, 100 microamperes to 1000 microamperes) because of the following reasons: variation in optical coupling efficiency between the front face of a semiconductor light emitting device and an optical waveguide or optical fiber; and because of variation in optical coupling efficiency between the rear face of the semiconductor light emitting device and the monitoring photodiode.

Even under the APC operation, optical coupling efficiency between the front face of a semiconductor light emitting device and an optical waveguide or optical fiber varies with change in temperature. This variation results in fluctuation in the ratio of the forward light to the monitor light. According to the inventors' estimation, the fluctuation of the forward light is in a range of approximately ±20 percent to ±40 percent.

However, the optical module and substrate product of the present embodiment can decrease the variations and fluctuations as described above.

The present invention has been illustratively described as above with the embodiments thereof. According to the embodiments, the semiconductor light emitting device can be located in the vicinity of the semiconductor driving element on the substrate. Therefore, the impedance can be low between the semiconductor driving element and the semiconductor light emitting device. The optical module and substrate product of the preferred example can achieve the transmission rates of approximately 1 to 5 Gigabits per second (Gb/s). Since the surface mounting technology can be used to the assembly of most components for the optical modules and substrate products of the embodiments, it is feasible to mount these components within a smaller mounting region and simplify the assembly steps. The optical modules of the embodiments may be single channel optical modules or multiple channel optical modules.

As described above, the present invention has provided the optical modules of the structure capable of containing the driving element therein which supplies the drive signal to the semiconductor light emitting element.

Having described and illustrated the principle of the invention in a preferred embodiment thereof, it is appreciated by those having skill in the art that the invention can be modified in arrangement and detail without departing from such principles. For example, the optical device can be provided to reflect a part of incident light in a predetermined wavelength band and transmit a part of the incident light in the band. The optical device having an optical spectrum in which the reflectivity outside the predetermined wavelength band is greater than that in the predetermined wavelength band may be included. We therefore claim all modifications and variations coming within the spirit and scope of the following claims.

What is claimed is:

1. An optical module comprising:
   a substrate having first and second regions and first and second optical waveguides, said first and second regions being arranged along a predetermined plane, and said first and second optical waveguides being provided in said first region, and said first and second optical waveguides extending in a direction of a predetermined axis;
   a semiconductor light emitting device including a semiconductor light emitting element, said semiconductor light emitting device being provided in the second region, and said semiconductor light emitting element being optically coupled to said second optical waveguide;
   a semiconductor light receiving device including a light receiving element, said semiconductor light receiving device being provided in said first region; and
   an optical device including an optical element, said optical element being provided on said first region so as to reflect a part of incident light from said light emitting element to said light receiving element and so as to transmit a part of said incident light;

wherein said optical element is provided between said first and second optical waveguides wherein said optical element is optically coupled to said first and second optical waveguides, wherein said optical device has a transparent substrate, wherein light from said semiconductor light emitting element can pass through said transparent substrate, wherein said transparent substrate has a pair of surfaces, each extending along a plane intersecting with said predetermined axis, and wherein one of said pair of surfaces is inclined so as to reflect a part of incident light from said light emitting element to said light receiving element.

2. An optical module comprising:

a substrate having first and second regions and first and second optical waveguides, said first and second regions being arranged along a predetermined plane, and said first and second optical waveguide being provided in said first region, and said first and second optical waveguides extending in a direction of a predetermined axis;

a semiconductor light emitting device including a semiconductor light emitting element, said semiconductor light emitting device being provided in the second region, and said semiconductor light emitting element being optically coupled to said second optical waveguide;

a semiconductor light receiving device including a light receiving element, said semiconductor light receiving device being provided in said first region; and an optical device including an optical element, said optical element being provided on said first region so as to reflect a part of incident light from said light emitting element to said light receiving element and so as to transmit a part of said incident light;

wherein said optical element is provided between said first and second optical waveguides wherein said optical element is optically coupled to said first and second optical waveguides, wherein said optical device has a transparent substrate and a dielectric multilayer film, wherein light from said semiconductor light emitting element can pass through said transparent substrate, and wherein said transparent substrate is inclined so as to reflect a part of incident light from said light emitting element to said light receiving element, and wherein said dielectric multilayer film is provided on said inclined surface of said transparent substrate.

3. The optical module according to claim 2, further comprising:

a semiconductor driving element electrically connected to said semiconductor light emitting element;

a mount member, said semiconductor driving element being mounted on said mount member;

wherein said substrate and said mount member are arranged along said predetermined plane.

4. The optical module according to claim 2, further comprising a semiconductor driving element electrically connected to said semiconductor light emitting element;

wherein said substrate has a third region, said first to third regions being arranged along said predetermined plane, and wherein said semiconductor driving element is provided in the third region of said substrate.

5. The optical module according to claim 2, wherein said substrate further includes at least one third optical waveguide and at least one fourth optical waveguide, said third optical waveguide and said fourth optical waveguide extending in a direction of another predetermined axis, wherein said semiconductor light emitting device further includes another semiconductor light emitting element provided in said second region, wherein said optical device further includes another optical element provided between said third and fourth optical waveguides, wherein said fourth waveguide is optically coupled to said other semiconductor light emitting element, wherein said semiconductor light receiving device further includes another light receiving element provided in said first region wherein said other semiconductor light emitting element is electrically connected to said semiconductor driving element, wherein said other light receiving element is optically coupled to the other optical element, wherein said other optical element is optically coupled to said third and fourth optical waveguides, wherein said other optical element is provided on said first region so as to reflect a part of incident light from said other light emitting element to said other light receiving element and so as to transmit a part of said incident light, and wherein said other optical element is provided between said third waveguide and said fourth waveguide.

6. The optical module according to claim 2, wherein said substrate includes a groove provided in said first region, wherein said substrate has a pair of edges extending in said direction of said predetermined axis, wherein said groove extends from one of said pair of edges to the other and extends along a reference plane intersecting with said predetermined plane, and wherein said optical device is provided in said groove.

7. The optical module according to claim 6, wherein an optical axis of said first optical waveguide extends along a reference axis, wherein said reference axis forms an acute angle with said reference plane.

8. The optical module according to claim 2, wherein said first region has a primary surface, wherein said primary surface has a first area and a second area arranged along said predetermined axis, wherein said first waveguide is located in said first area, wherein said second waveguide is located in said second area, and wherein said semiconductor light receiving device is located on said second area.

9. The optical module according to claim 2, further comprising a transparent resin, said transparent resin being provided on said substrate so as to cover said semiconductor light emitting element, said light receiving element, and said optical element, wherein light from said semiconductor light emitting element can pass through said transparent resin.

10. The optical module according to claim 2, wherein said light receiving element has a light entrance surface for receiving light from said optical element, wherein said light receiving element is located such that said light entrance surface is directed toward said second optical waveguide, and wherein said light receiving element is a back illuminated type semiconductor light receiving element.

11. The optical module according to claim 2, further comprising a lead frame, said lead frame having an island and a plurality of lead terminals, said substrate being mounted on said island.

12. The optical module according to claim 2, further comprising a resin, said resin containing said substrate, said semiconductor light emitting element, said light receiving element, and said semiconductor driving element therein.

13. An optical module comprising:
 a substrate having first and second regions arranged along a predetermined plane;
 a first optical fiber provided in said first region of said substrate, said first optical fiber extending in a direction of a predetermined axis;
 a second optical fiber provided in said first region of said substrate, said second optical fiber extending in said direction of said predetermined axis;
 a semiconductor light emitting device provided in the second region, said semiconductor light emitting device including a semiconductor light emitting element, and said semiconductor light emitting element being optically coupled to said second optical fiber;
 a semiconductor driving element electrically connected to said semiconductor light emitting element;
 an optical device including an optical element, said optical element being provided in said first region so as to reflect a part of incident light and so as to transmit a part of said incident light,
 a semiconductor light receiving device including a light receiving element, said light receiving element being provided in said first region, and said light receiving element being optically coupled to said optical element,
 wherein said optical element is provided between said first optical fiber and said second optical fiber,
 wherein said optical element is optically coupled to said first optical fiber and said second optical fiber,
 wherein said optical device has a transparent substrate,
 wherein light from said semiconductor light emitting element can pass through said transparent substrate,
 wherein said transparent substrate has a pair of surfaces, each extending along a reference plane intersecting with said predetermined axis, and
 wherein one of said pair of surfaces is inclined so as to reflect a part of incident light from said light emitting element to said light receiving element.

14. An optical module comprising:
 a substrate having first and second regions arranged along a predetermined plane;
 a first optical fiber provided in said first region of said substrate, said first optical fiber extending in a direction of a predetermined axis;
 a second optical fiber provided in said first region of said substrate, said second optical fiber extending in said direction of said predetermined axis;
 a semiconductor light emitting device provided in the second region, said semiconductor light emitting device including a semiconductor light emitting element, and said semiconductor light emitting element being optically coupled to said second optical fiber;
 a semiconductor driving element electrically connected to said semiconductor light emitting element;
 an optical device including an optical element, said optical element being provided in said first region so as to reflect a part of incident light and so as to transmit a part of said incident light,
 a semiconductor light receiving device including a light receiving element, said light receiving element being provided in said first region, and said light receiving element being optically coupled to said optical element,
 wherein said optical element is provided between said first optical fiber and said second optical fiber,
 wherein said optical element is optically coupled to said first optical fiber and said second optical fiber,
 wherein said optical device has a transparent substrate and a dielectric multilayer film,
 wherein light from said semiconductor light emitting element can pass through said transparent substrate,
 wherein one of said pair of surfaces is inclined so as to reflect a part of incident light from said light emitting element to said light receiving element, and
 wherein said dielectric multilayer film is provided on said inclined surface of said transparent substrate.

15. The optical module according to claim 14, further comprising a mount member, said semiconductor driving element is mounted on said mount member,
 wherein said mount member and said substrate are arranged along said predetermined plane.

16. The optical module according to claim 14,
 wherein said substrate further includes a third region,
 wherein said first to third regions are arranged along said predetermined plane, and
 wherein said semiconductor driving element is provided on said third region.

17. The optical module according to claim 14, further comprising at least one third optical fiber and at least one fourth optical fiber, said third optical fiber and said fourth optical fiber extending in a direction of another predetermined axis,
 wherein said semiconductor light emitting device further includes another semiconductor light emitting element provided in said second region,
 wherein said other semiconductor light emitting element is optically coupled to said fourth optical fiber,
 wherein said semiconductor light receiving device further includes another light receiving element provided in said first region,
 wherein said optical device further includes another optical element provided between said third and fourth optical fibers,
 wherein said other optical element is provided on said first region so as to reflect a part of incident light from said other light emitting element to said other light receiving element and so as to transmit a part of said incident light,
 wherein said other optical element is optically coupled to said third and fourth optical fibers,
 wherein said other light receiving element is optically coupled to said other optical element, and
 wherein said other semiconductor light emitting element is electrically connected to said semiconductor driving element.

18. The optical module according to claim 14,
 wherein said first region has a primary surface,
 wherein said primary surface has a first area and a second area arranged along said predetermined axis,
 wherein said first optical fiber is located in said first area,
 wherein said second optical fiber is located in said second area, and wherein said semiconductor light receiving device is located on said second area.

19. The optical module according to claim 14, wherein said second fiber is provided between said light receiving element and said substrate.

20. The optical module according to claim 14, further comprising a mount component, said semiconductor light receiving device is mounted on said mount component,
wherein said second optical fiber is provided between said mount component and said substrate.

21. The optical module according to claim 14,
wherein said substrate includes a groove provided in said first region,
wherein said substrate has a pair of edges extending in said direction of said predetermined axis,
wherein said groove extends from one of said pair of edges to the other and extends along a reference plane intersecting with said predetermined plane, and
wherein said optical device is provided in said groove.

22. The optical module according to claim 21,
wherein an optical axis of said first optical fiber extends along a reference axis,
wherein said reference axis forms an acute angle with said reference plane.

23. The optical module according to claim 14, further comprising a transparent resin, said transparent resin being provided on said substrate so as to cover said semiconductor light emitting element, said light receiving element, and said optical element,
wherein light from said semiconductor light emitting element can pass through said transparent resin.

24. The optical module according to claim 14, wherein said light receiving element has a light entrance surface which receives light from said optical element,
wherein said light receiving element is located such that said light entrance surface is directed toward said first optical fiber, and
wherein said light receiving element is a back illuminated type semiconductor light receiving element.

25. The optical module according to claim 14, further comprising a lead frame having an island and a plurality of lead terminals, said substrate being mounted on said island.

26. The optical module according to claim 14, further comprising a resin, said resin containing said substrate, said semiconductor light emitting element, said light receiving element, and said semiconductor driving element therein.

* * * * *